US012672370B2

(12) United States Patent (10) Patent No.: US 12,672,370 B2

Okawa et al. (45) Date of Patent: Jun. 30, 2026

(54) SOLID-STATE IMAGING ELEMENT AND ELECTRONIC EQUIPMENT

(71) Applicant: SONY SEMICONDUCTOR SOLUTIONS CORPORATION, Kanagawa (JP)

(72) Inventors: Tatsuya Okawa, Kanagawa (JP); Yosuke Satake, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 336 days.

(21) Appl. No.: 18/548,034

(22) PCT Filed: Jan. 25, 2022

(86) PCT No.: PCT/JP2022/002609
§ 371 (c)(1),
(2) Date: Aug. 25, 2023

(87) PCT Pub. No.: WO2022/185785

PCT Pub. Date: Sep. 9, 2022

(65) Prior Publication Data

US 2024/0136371 A1 Apr. 25, 2024
US 2024/0234449 A9 Jul. 11, 2024

(30) Foreign Application Priority Data

Mar. 4, 2021 (JP) ................................. 2021-034432

(51) Int. Cl.
*H10F 39/00* (2025.01)
(52) U.S. Cl.
CPC ................................. *H10F 39/8027* (2025.01)
(58) Field of Classification Search
CPC ......... H04N 25/70; H10F 39/12; H10F 39/18; H10F 39/199; H10F 39/802;
(Continued)

(56) References Cited

U.S. PATENT DOCUMENTS

2017/0104020 A1* 4/2017 Lee ........................ H10F 39/807
2017/0301718 A1* 10/2017 Chou ................... H04N 25/704
(Continued)

FOREIGN PATENT DOCUMENTS

JP H05-15907 1/1993
JP 2008-086390 4/2008
(Continued)

OTHER PUBLICATIONS

International Search Report and Written Opinion prepared by the Japan Patent Office on Apr. 6, 2022, for International Application No. PCT/JP2022/002609, 2 pgs.

*Primary Examiner* — Shaun M Campbell
(74) *Attorney, Agent, or Firm* — SHERIDAN ROSS P.C.

(57) ABSTRACT

A solid-state imaging element having an array of light receiving pixels is disclosed. A light receiving pixel includes a pair of photoelectric conversion units, a first separation region, and a second separation region. The pair of photoelectric conversion units is disposed adjacent to each other and has a shared floating diffusion (FD). The first separation region surrounds the pair of photoelectric conversion units. The second separation region is disposed between the pair of photoelectric conversion units. The first separation region has a rectangular shape in plan view and extends from a surface on the opposite side to a light incident surface of the semiconductor layer toward the light incident surface. The second separation region is disposed along a diagonal line of the first separation region extends from the surface on the opposite side to the light incident surface of the semiconductor layer toward the light incident surface.

17 Claims, 26 Drawing Sheets

(58) Field of Classification Search
    CPC ............. H10F 39/8027; H10F 39/8037; H10F
                                    39/807; H10F 39/813
    See application file for complete search history.

(56)                    References Cited

U.S. PATENT DOCUMENTS

| | | | |
|---|---|---|---|
| 2018/0006077 A1* | 1/2018 | Lee ........................ | H04N 25/77 |
| 2018/0219040 A1 | 8/2018 | Choi et al. | |
| 2019/0198546 A1* | 6/2019 | Kato ................... | H10F 39/8037 |
| 2020/0187859 A1 | 6/2020 | Yoshioka et al. | |
| 2020/0235149 A1* | 7/2020 | Shiraishi ................ | H10F 39/12 |
| 2021/0091135 A1* | 3/2021 | Yokogawa ............ | H10F 39/806 |
| 2021/0121113 A1 | 4/2021 | Katsuhara et al. | |

FOREIGN PATENT DOCUMENTS

| | | |
|---|---|---|
| JP | 2014-033871 | 2/2014 |
| JP | 2017-084930 | 5/2017 |
| JP | 2018-187359 | 11/2018 |
| JP | 2018-195908 | 12/2018 |
| JP | 2018-201015 | 12/2018 |
| JP | 2019-136055 | 8/2019 |
| JP | 2019-198448 | 11/2019 |
| WO | WO-2018211971 A1 | 11/2018 |
| WO | WO-2018221443 A1 | 12/2018 |

* cited by examiner

SOLID-STATE IMAGING ELEMENT AND ELECTRONIC EQUIPMENT

CROSS REFERENCE TO RELATED APPLICATIONS

This application is a national stage application under 35 U.S.C. 371 and claims the benefit of PCT Application No. PCT/JP2022/002609, having an international filing date of 25 Jan. 2022, which designated the United States, which PCT application claimed the benefit of Japanese Patent Application No. 2021-034432, filed 4 Mar. 2021, the entire disclosures of each of which are incorporated herein by reference.

FIELD

The present disclosure relates to a solid-state imaging element and electronic equipment.

BACKGROUND

In recent years, in a back-illuminated complementary metal oxide semiconductor (CMOS) image sensor, there has been a technology for making light incident on a pair of photodiodes from the same on-chip lens to thereby realize detection of a phase difference (see, for example, Patent Literature 1).

CITATION LIST

Patent Literature

Patent Literature 1: US 2018/0219040 A

SUMMARY

Technical Problem

However, in the related art described above, there is room for further improvement in that a saturation signal charge amount of the photodiodes is increased in a light receiving pixel (hereinafter referred to as phase difference detection pixel as well) that detects the phase difference.

Therefore, the present disclosure proposes a solid-state imaging element and electronic equipment capable of increasing a saturation signal charge amount of a photodiode in a phase difference detection pixel.

Solution to Problem

According to the present disclosure, there is provided a solid-state imaging element. The solid-state imaging element includes a plurality of light receiving pixels arrayed in a matrix on an inside of a semiconductor layer. And the light receiving pixel includes a pair of photoelectric conversion units, a first separation region, and a second separation region. The pair of photoelectric conversion units is disposed adjacent to each other and has a shared floating diffusion. The first separation region is disposed to surround the pair of photoelectric conversion units. The second separation region is disposed between the pair of photoelectric conversion units. The first separation region has a rectangular shape in plan view and is provided to extend from a surface on the opposite side to a light incident surface of the semiconductor layer toward the light incident surface. The second separation region is disposed along a diagonal line of the first separation region having the rectangular shape in plan view and is provided to extend from the surface on the opposite side to the light incident surface of the semiconductor layer toward the light incident surface.

DESCRIPTION OF EMBODIMENT

Figure 1:
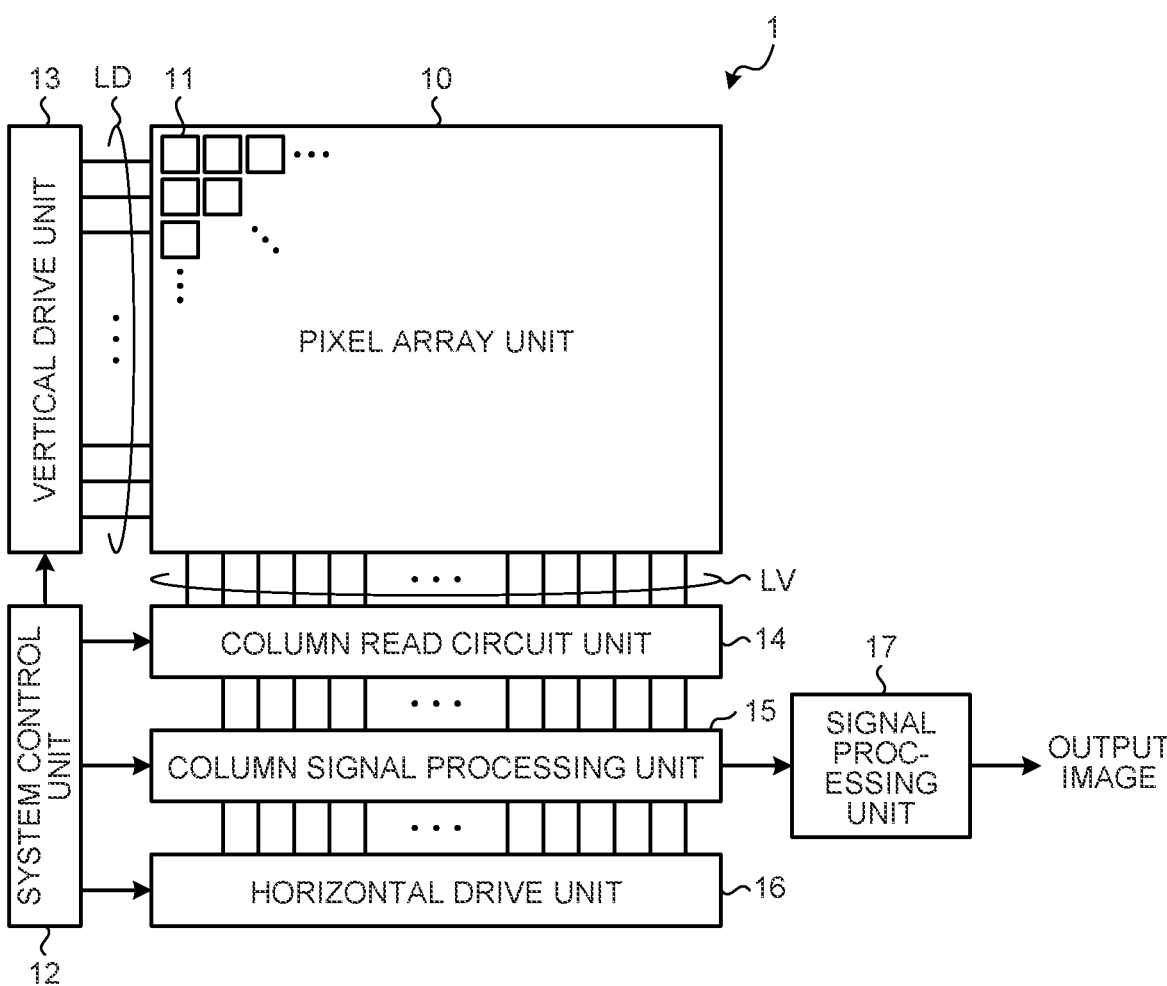
FIG. 1 is a system configuration diagram illustrating a schematic configuration example of a solid-state imaging element according to embodiments of the present disclosure.

Embodiments of the present disclosure are explained in detail below with reference to the drawings. Note that, in the embodiments explained below, redundant explanation is omitted by denoting the same parts with the same reference numerals and signs.

In recent years, in a back-illuminated complementary metal oxide semiconductor (CMOS) image sensor, there has been a technology for making light incident on a pair of photodiodes from the same on-chip lens to thereby realize detection of a phase difference.

In such an image sensor, it is possible to improve a dynamic range and an SN ratio by increasing a saturation signal charge amount (Qs) of the photodiodes.

However, in the related art described above, it is necessary to form a separation region between the pair of photodiodes that detects the phase difference and it is also necessary to form an overflow path in the separation region. Therefore, a volume of the photodiodes themselves sometimes cannot be sufficiently secured.

That is, in the related art described above, there is room for further improvement in that the saturation signal charge amount of the photodiodes is increased in the light receiving pixel (hereinafter also referred to as a phase difference detection pixel) that detects the phase difference.

Therefore, it is expected to realize a technology that can overcome the problems described above and increase the saturation signal charge amount of the photodiodes in the phase difference detection pixel.

[Configuration of a Solid-State Imaging Element]

FIG. 1 is a system configuration diagram illustrating a schematic configuration example of a solid-state imaging element 1 according to each embodiment of the present disclosure. As illustrated in FIG. 1, a solid-state imaging element 1, which is a CMOS image sensor, includes a pixel array unit 10, a system control unit 12, a vertical drive unit 13, a column read circuit unit 14, a column signal processing unit 15, a horizontal drive unit 16, and a signal processing unit 17.

The pixel array unit 10, the system control unit 12, the vertical drive unit 13, the column read circuit unit 14, the column signal processing unit 15, the horizontal drive unit 16, and the signal processing unit 17 are provided on the same semiconductor substrate or on a plurality of electrically connected laminated semiconductor substrates.

In the pixel array unit 10, light receiving pixels 11 including photoelectric conversion elements (photodiodes PD (see FIG. 3)) capable of photoelectrically converting a charge amount corresponding to an incident light amount, accumulating the charge amount on the inside, and outputting the charge amount as a signal are two-dimensionally arranged in a matrix.

Besides the light receiving pixels 11, the pixel array unit 10 sometimes includes a region where dummy pixels having a structure not including the photodiodes PD, light blocking pixels in which light incidence from the outside is blocked by shielding light receiving surfaces from light, and the like are arranged in rows and/or columns.

Note that the light blocking pixels may have the same configuration as the configuration of the light receiving pixels 11 except that the light-receiving surfaces are shielded from light. In the following explanation, a photoelectric charge of a charge amount corresponding to an amount of incident light is sometimes simply referred to as "charge" as well and the light receiving pixel 11 is sometimes simply referred to as "pixel" as well.

In the pixel array unit 10, pixel drive lines LD are formed for each of the rows in the left-right direction in the drawing (an array direction of pixels in pixel rows) with respect to the pixel array in a matrix and vertical pixel wires LV are formed for each of the columns in the up-down direction in the drawing (an array direction of pixels in pixel columns). One ends of the pixel drive lines LD are connected to output ends corresponding to the rows of the vertical drive unit 13.

The column read circuit unit 14 includes at least a circuit that supplies, for each of the columns, a constant current to the light receiving pixels 11 in a selected row in the pixel array unit 10, a current mirror circuit, and a changeover switch for the light receiving pixels 11 to be read.

The column read circuit unit 14 configures an amplifier in conjunction with a transistor in the selected pixel in the pixel array unit 10, converts a photoelectric charge signal into a voltage signal, and outputs the voltage signal to the vertical pixel wires LV.

The vertical drive unit 13 includes a shift register and an address decoder and drives the light receiving pixels 11 of the pixel array unit 10 at the same time for all pixels or in units of rows. Although a specific configuration of the vertical drive unit 13 is not illustrated, the vertical drive unit 13 has a configuration including a read scanning system and a sweep scanning system or a batch sweeping and batch transfer system.

The read scanning system sequentially selects and scans the light receiving pixels 11 of the pixel array unit 10 in units of rows in order to read the pixel signal from the light receiving pixels 11. In the case of row driving (a rolling shutter operation), about sweeping, sweep scanning is performed on a read row on which read scanning is performed by the read scanning system prior to the read scanning by a time of a shutter speed.

In the case of global exposure (a global shutter operation), batch sweeping is performed prior to batch transfer by the time of the shutter speed. By such sweeping, unnecessary charges are swept (reset) from the photodiodes PD of the light receiving pixels 11 in the read row. Then, a so-called electronic shutter operation is performed by sweeping (resetting) the unnecessary charges.

Here, the electronic shutter operation means an operation for discarding unnecessary photoelectric charges accumulated in the photodiode PD until immediately before the electronic shutter operation and starting exposure anew (starting accumulation of photoelectric charges).

A signal read by the read operation by the read scanning system corresponds to an amount of light made incident after the immediately preceding read operation or electronic shutter operation. In the case of the row driving, a period from read timing by the immediately preceding read operation or sweep timing by the electronic shutter operation to read timing by the current read operation is a photoelectric charge accumulation time (an exposure time) in the light receiving pixels 11. In the case of the global exposure, a time from the batch sweeping to the batch transfer is an accumulation time (an exposure time).

Pixel signals output from the light receiving pixels 11 of a pixel row selectively scanned by the vertical drive unit 13 are supplied to the column signal processing unit 15 through each of the vertical pixel wires LV. The column signal processing unit 15 performs, for each of the pixel columns of the pixel array unit 10, predetermined signal processing on the pixel signals output from the light receiving pixels 11 of the selected row through the vertical pixel wire LV and temporarily holds the pixel signals after the signal processing.

Specifically, the column signal processing unit 15 performs at least noise removal processing, for example, correlated double sampling (CDS) processing as the signal processing. By the CDS processing by the column signal processing unit 15, fixed pattern noise specific to pixels such as reset noise and threshold variation of an amplification transistor AMP is removed.

Note that the column signal processing unit 15 can be imparted with, for example, an AD conversion function besides the noise removal processing and configured to output a pixel signal as a digital signal.

The horizontal drive unit 16 includes a shift register and an address decoder and sequentially selects unit circuits corresponding to the pixel columns of the column signal processing unit 15. By the selective scanning by the horizontal drive unit 16, the pixel signals subjected to the signal processing by the column signal processing unit 15 are sequentially output to the signal processing unit 17.

The system control unit 12 includes a timing generator that generates various timing signal and performs drive control for the vertical drive unit 13, the column signal processing unit 15, the horizontal drive unit 16, and the like based on various timing signals generated by the timing generator.

The solid-state imaging element 1 further includes a signal processing unit 17 and a not-illustrated data storage unit. The signal processing unit 17 has at least an addition processing function and performs various kinds of signal processing such as addition processing on the pixel signal output from the column signal processing unit 15.

In signal processing in the signal processing unit 17, the data storage unit temporarily stores data necessary for the processing. The signal processing unit 17 and the data storage unit may be an external signal processing unit provided on a substrate different from a substrate on which the solid-state imaging element 1 is provided, may perform, for example, processing by a digital signal processor (DSP) or software, or may be mounted on the same substrate as the substrate on which the solid-state imaging element 1 is mounted.

Pixel Circuit in a First Embodiment

Figure 2:
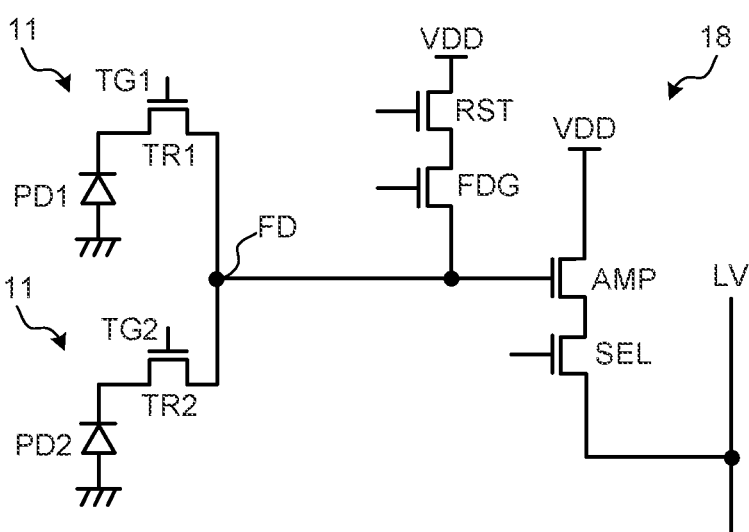
FIG. 2 is a diagram illustrating an example of a pixel circuit according to a first embodiment of the present disclosure.

Subsequently, an example of a pixel circuit according to a first embodiment is explained with reference to FIG. 2. FIG. 2 is a diagram illustrating the example of the pixel circuit according to the first embodiment of the present disclosure.

As illustrated in FIG. 2, in the first embodiment, a pair of light receiving pixels 11 shares one read circuit 18. Here, "share" means that the pair of light receiving pixels 11 is electrically connected to a common read circuit 18, that is, outputs of the pair of light receiving pixels 11 are input to the common read circuit 18.

The light receiving pixels 11 includes common component each other. In FIG. 2, in order to distinguish the components of the light receiving pixels 11 from each other, identification numbers (1 and 2) are added to the ends of signs of the components of the light receiving pixels 11.

In the present disclosure, when it is necessary to distinguish the components of the light receiving pixels 11 from each other, identification numbers are added to the ends of the signs of the components of the light receiving pixels 11. On the other hand, in the present disclosure, when it is unnecessary to distinguish the components of the light receiving pixels 11 from each other, the identification numbers at the ends of the signs of the components of the light receiving pixels 11 are omitted.

The light receiving pixels 11 respectively include, for example, photodiodes PD and transfer transistors TR electrically connected to the photodiodes PD. The photodiodes PD are an example of a photoelectric conversion unit.

These light receiving pixels 11 share a floating diffusion FD electrically connected to the transfer transistors TR. Here, "share" means that the individual photodiodes PD of the light receiving pixels 11 are electrically connected to the floating diffusion FD.

The photodiodes PD perform photoelectric conversion to generate charges corresponding to amounts of received light. Cathodes of the photodiodes PD are electrically connected to sources of the transfer transistors TR and anodes of the photodiodes PD are electrically connected to a reference potential line (for example, the ground potential).

Drains of the transfer transistors TR are electrically connected to the floating diffusion FD and transfer gates TG, which are gates of the transfer transistors TR, are electrically connected to the pixel drive line LD (see FIG. 1). The transfer transistors TR are, for example, CMOS transistors.

The floating diffusion FD is common to the light receiving pixels 11 that share one read circuit 18 and is electrically connected to an input end of the read circuit 18 common to the light receiving pixels 11. The floating diffusion FD temporarily holds charges output from the photodiodes PD via the transfer transistors TR.

As illustrated in FIG. 2, the read circuit 18 includes, for example, a reset transistor RST, a selection transistor SEL, an amplification transistor AMP, and a switching transistor FDG. The reset transistor RST, the amplification transistor AMP, the selection transistor SEL, and the switching transistor FDG are, for example, CMOS transistors. Note that the selection transistor SEL and the switching transistor FDG may be omitted according to necessity.

A source of the switching transistor FDG, which is an input unit of the read circuit 18, is electrically connected to the floating diffusion FD and a drain of the switching transistor FDG is electrically connected to a source of the reset transistor RST. A gate of the switching transistor FDG is electrically connected to the pixel drive line LD.

A drain of the reset transistor RST is electrically connected to a power supply voltage VDD and a gate of the reset transistor RST is electrically connected to the pixel drive line LD.

A source of the amplification transistor AMP is electrically connected to a drain of the selection transistor SEL and a drain of the amplification transistor AMP is electrically connected to the power supply voltage VDD. A gate of the amplification transistor AMP is electrically connected to the source of the switching transistor FDG and the floating diffusion FD.

A source of the selection transistor SEL, which is an output unit of the read circuit 18, is electrically connected to the vertical pixel wire LV and a gate of the selection transistor SEL is electrically connected to the pixel drive line LD.

When the transfer transistors TR are turned on, the transfer transistors TR transfer charges of the photodiodes PD to the floating diffusion FD.

The reset transistor RST resets the potential of the floating diffusion FD to predetermined potential. When the reset transistor RST is turned on, the reset transistor RST resets the potential of the floating diffusion FD to the potential of the power supply voltage VDD. The selection transistor SEL controls output timing of a pixel signal from the read circuit 18.

The amplification transistor AMP generates, as a pixel signal, a signal having a voltage corresponding to a level of a charge held in the floating diffusion FD. The amplification transistor AMP configures a source follower type amplifier and outputs a pixel signal having a voltage corresponding to a level of a charge generated in the photodiode PD.

When the selection transistor SEL is turned on, the amplification transistor AMP amplifies the potential of the floating diffusion FD and outputs a voltage corresponding to the potential to the column signal processing unit 15 (see FIG. 1) via the vertical pixel wire LV.

The switching transistor FDG is used to switch the conversion efficiency. In general, a pixel signal is small at the time of photographing in a dark place. If the capacitance of the floating diffusion FD (hereinafter referred to as FD capacitance) is large when charge-voltage conversion is performed based on Q=CV, V at the time when a charge is converted into a voltage by the amplification transistor AMP is small.

On the other hand, since the pixel signal is large in a bright place, the floating diffusion FD cannot receive the charge of the photodiode PD unless the FD capacitance is large. Further, the FD capacitance needs to be large such that V at the time a charge is converted into a voltage by the amplification transistor AMP is not excessively large (In other words, is small).

That is, when the switching transistor FDG is turned on, since gate capacitance for the switching transistor FDG increases, overall FD capacitance increases. On the other hand, when the switching transistor FDG is turned off, the overall FD capacitance decreases. As explained above, by switching the state of the switching transistor FDG, the FD capacitance can be changed and the conversion efficiency can be switched.

Light Receiving Pixel in the First Embodiment

Figure 3:
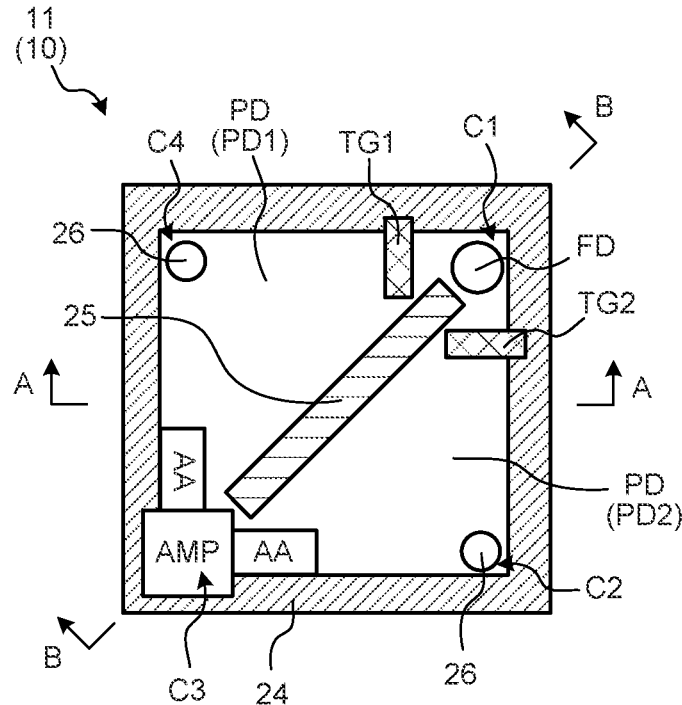
FIG. 3 is a plan view illustrating an example of a configuration of a light receiving pixel according to the first embodiment of the present disclosure.

Subsequently, a detailed configuration of the light receiving pixel 11 according to the first embodiment is explained with reference to FIG. 3 to FIG. 6. FIG. 3 is a plan view illustrating an example of a configuration of the light receiving pixel 11 according to the first embodiment of the present disclosure.

Figure 4:
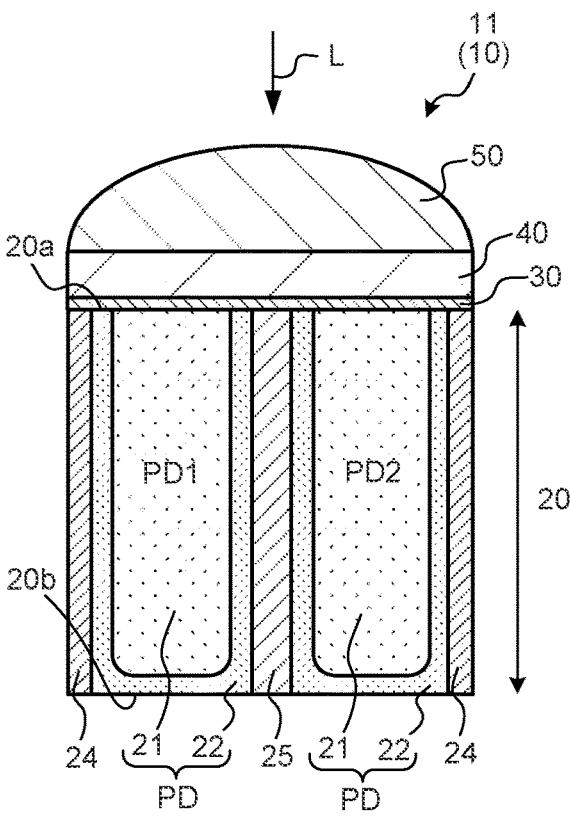
FIG. 4 is an arrow sectional view taken along line A-A illustrated in FIG. 3.
Figure 5:
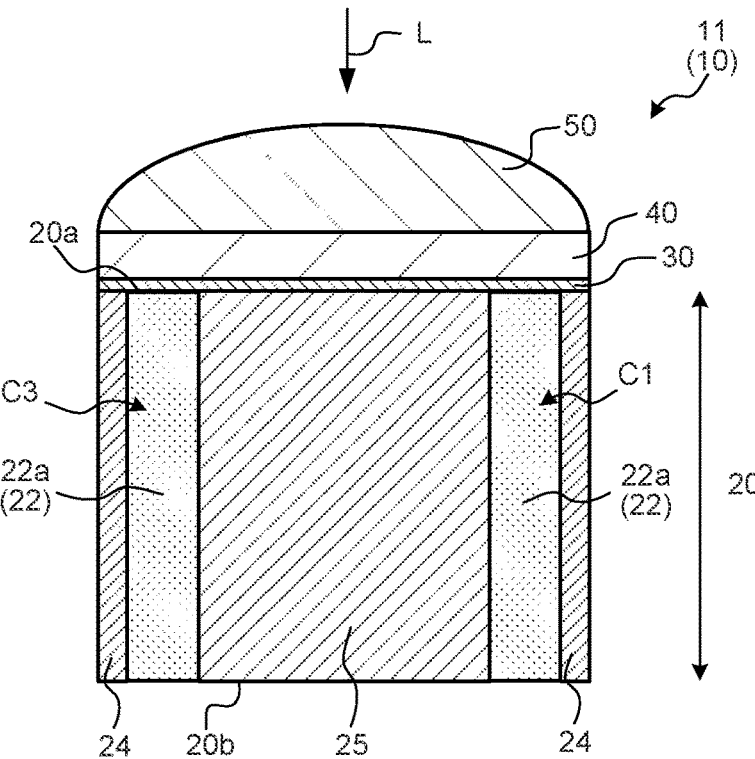
FIG. 5 is an arrow sectional view taken along line B-B illustrated in FIG. 3.

FIG. 4 is an arrow sectional view taken along line A-A illustrated in FIG. 3. FIG. 5 is an arrow sectional view taken along line B-B illustrated in FIG. 3. Note that illustration of the pixel transistor, the floating diffusion FD, and the like is omitted in the sectional views illustrated in FIG. 4 and FIG. 5.

As illustrated in FIG. 4 and the like, the pixel array unit 10 includes a semiconductor layer 20, a planarizing film 30, a color filter 40, and an on-chip lens 50.

The semiconductor layer 20 contains, for example, silicon. The semiconductor layer 20 includes a plurality of photodiodes PD. The photodiodes PD are an example of a photoelectric conversion unit. Note that a pair of photodiodes PD1 and PD2 is provided in one light receiving pixel 11. Since the pair of photodiodes PD1 and PD2 are provided, the light receiving pixel 11 functions as a phase difference detection pixel.

The photodiode PD includes a first impurity region 21 containing impurities of a first conduction type (for example, N-type) and a second impurity region 22 containing impurities of a second conduction type (for example, P-type).

The first impurity region 21 is disposed in the center of the photodiode PD and the second impurity region 22 is disposed along a side and the bottom (a part on the opposite side to a side on which light L is made incident) of the first impurity region 21.

The light receiving pixel 11 includes a first separation region 24 and a second separation region 25. As illustrated in FIG. 3, the first separation region 24 is disposed to surround the pair of photodiodes PD in one light receiving pixel 11.

As illustrated in FIG. 4 and FIG. 5, the first separation region 24 is provided to pierce through the semiconductor layer 20. The first separation region 24 is made of, for example, a dielectric having a low refractive index such as silicon oxide (SiO$_2$). Consequently, the first separation region 24 can optically and electrically separate the plurality of light receiving pixels 11 adjacent to each other.

As illustrated in FIG. 3, the second separation region 25 is disposed between a pair of photodiodes PD adjacent to each other in one light receiving pixel 11. As illustrated in FIG. 5, the second separation region 25 is provided to pierce through the semiconductor layer 20.

The second separation region 25 is made of, for example, a dielectric having a low refractive index such as silicon oxide. Consequently, the second separation region 25 can optically and electrically separate the pair of photodiodes PD adjacent to each other.

As explained above, in the first embodiment, since the pair of photodiodes PD can be separated from each other using the second separation region 25, a phase difference of the incident light L can be detected using the pair of photodiodes PD.

Here, in the first embodiment, as illustrated in FIG. 3, the second separation region 25 is disposed along one diagonal line of two diagonal lines of the first separation region 24 having a rectangular shape in plan view. For example, when four corners of the first separation region 24 having the rectangular shape in plan view are represented as a corner C1, a corner C2, a corner C3, and a corner C4 in clockwise order from the upper right, the second separation region 25 is disposed along a diagonal line extending between the corner C1 and the corner C3.

Consequently, the volume of the photodiodes PD can be increased compared with when the second separation region 25 is disposed along different directions (for example, directions substantially parallel to one side of the first separation region 24) in plan view. Therefore, according to the first embodiment, a saturation signal charge amount of the photodiodes PD can be increased in the phase difference detection pixel.

In the first embodiment, as illustrated in FIG. 3, it is desirable that the first separation region 24 and the second separation region 25 are not in contact with each other in plan view. Consequently, an overflow path connecting the pair of photodiodes PD can be disposed in a gap (for example, the vicinity of the corner C1 and the vicinity of the corner C3) formed between the first separation region 24 and the second separation region 25.

Therefore, according to the first embodiment, since it is possible to prevent the volume of the photodiodes PD from decreasing by separately forming such an overflow path, it is possible to further increase the saturation signal charge amount of the photodiodes PD in the phase difference detection pixel.

In the first embodiment, since the first separation region 24 and the second separation region 25 are not in contact with each other in plan view, the pixel transistor, the floating diffusion FD, and the like can be disposed in the gap formed between the first separation region 24 and the second separation region 25.

For example, in the example illustrated in FIG. 3, in plan view, the floating diffusion FD is disposed at the corner C1 and the pixel transistor (for example, the amplification transistor AMP) and an active region AA of the pixel transistor are disposed at the corner C3.

That is, in the first embodiment, since the first separation region 24 and the second separation region 25 are not in contact with each other in plan view, it is possible to improve layout efficiency of the pixel array unit 10. Note that the floating diffusion FD and the pixel transistor are provided, for example, on a surface 20b on the opposite side a light incident surface 20a of the semiconductor layer 20 in sectional view.

Figure 6:
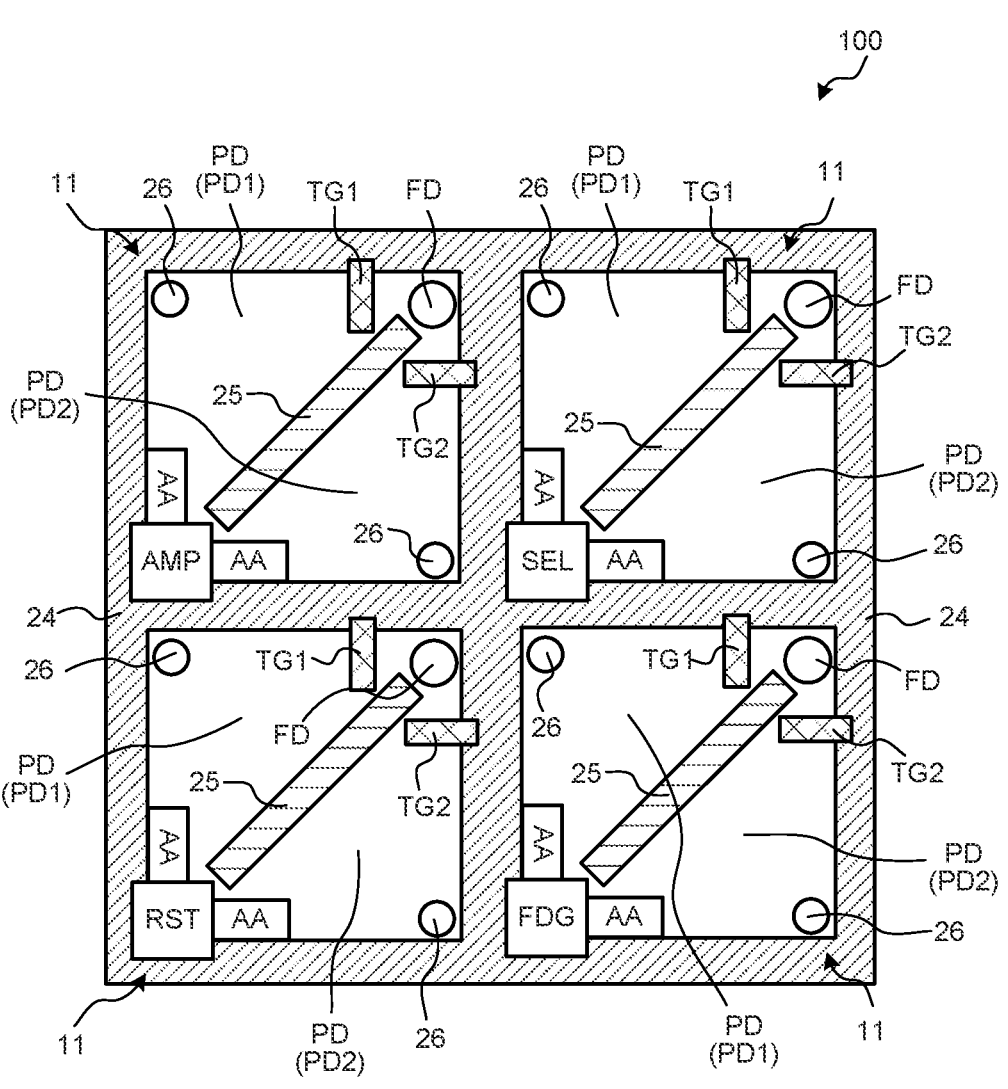
FIG. 6 is a plan view illustrating an example of a configuration of a light receiving pixel group according to the first embodiment of the present disclosure.

The pixel transistor disposed at the corner C3 is not limited to the amplification transistor AMP. FIG. 6 is a plan view illustrating an example of a configuration of a light receiving pixel group 100 according to the first embodiment of the present disclosure.

In the first embodiment, as illustrated in FIG. 6, one light receiving pixel group 100 includes four light receiving pixels 11 arranged in two rows and two columns in plan view. The four light receiving pixels 11 included in the one light receiving pixel group 100 share one read circuit 18 (see FIG. 2).

Then, in the first embodiment, in the one light receiving pixel group 100, the amplification transistor AMP is disposed at the corner C3 (see FIG. 3) of one (for example, upper left) light receiving pixel 11 and the selection transistor SEL is disposed at the corner C3 of one (for example, upper right) light receiving pixel 11.

In the one light receiving pixel group 100, the reset transistor RST is disposed at the corner C3 of one (for example, lower left) light receiving pixel 11 and the switching transistor FDG is disposed at the corner C3 of one (for example, lower right) light receiving pixel 11.

As explained above, in the first embodiment, various types of pixel transistors may be disposed at the corners C3 of the plurality of light receiving pixels 11 in a so-called 4×2 shared light receiving pixel group 100. Consequently, it is possible to further improve the layout efficiency of the pixel array unit 10.

In the first embodiment, the first separation region 24 and the second separation region 25 are desirably provided to pierce through the semiconductor layer 20. Consequently, as illustrated in FIG. 4, the second impurity region 22 can be formed not only in the bottom but also on the side of the first impurity region 21.

This is because, in a process for forming the first separation region 24 and the second separation region 25, the impurity of the second conduction type can also be diffused from sidewalls of trenches formed in parts corresponding to the first separation region 24 and the second separation region 25.

Therefore, according to the first embodiment, since the area of PN junction surfaces of the photodiodes PD can be enlarged, it is possible to further increase the saturation signal charge amount of the photodiodes PD.

In the first embodiment, through a process for diffusing the impurity of the second conduction type from the side walls of the trenches formed in the parts corresponding to the first separation region 24 and the second separation region 25, as illustrated in FIG. 5, a second impurity region 22a can also be formed at the corner C1 and the corner C3.

Consequently, it is possible to form the overflow path connecting the pair of photodiodes PD without separately cutting out a part of the second separation region 25 to form the second impurity region. That is, in the first embodiment, the second impurity region 22a illustrated in FIG. 5 functions as the overflow path connecting the pair of photodiodes PD to each other.

As explained above, in the first embodiment, the volume of the photodiodes PD can be increased compared with when the overflow path is formed by cutting out a part of the second separation region 25. Therefore, according to the first embodiment, it is possible to further increase the saturation signal charge amount of the photodiodes PD in the phase difference detection pixel.

In the first embodiment, it is possible to omit a process for separately cutting out a part of the second separation region 25 to form the second impurity region. Therefore, according to the first embodiment, since a manufacturing process for the pixel array unit 10 can be simplified, it is possible to reduce manufacturing cost for the solid-state imaging element 1.

Explanation of other parts in the pixel array unit 10 is continued. The light receiving pixel 11 further includes contact regions 26 and transfer gates TG1 and TG2. The contact regions 26 and the transfer gates TG1 and TG2 are provided on a surface 20b on the opposite side to the light incident surface 20a of the semiconductor layer 20.

The contact regions 26 are electrically connected to the reference potential line and are respectively disposed at the corner C2 and the corner C4 of the light receiving pixel 11 in plan view as illustrated in FIG. 3. A contact region 26 disposed at the corner C2 is electrically connected to the photodiode PD2 and the contact region 26 disposed at the corner C4 is electrically connected to the photodiode PD1.

The transfer gate TG1 is adjacent to the floating diffusion FD in plan view and is disposed to block the floating diffusion FD and the photodiode PD1.

The transfer gate TG2 is adjacent to the floating diffusion FD in plan view and is disposed to block the floating diffusion FD and the photodiode PD2.

As illustrated in FIG. 4 and the like, the planarizing film 30 is disposed on the light incident surface 20a of the semiconductor layer 20 and planarizes the light incident surface 20a. The planarizing film 30 is made of, for example, silicon oxide.

Note that, in the first embodiment, a not-illustrated fixed charge film may be disposed between the photodiode PD and the first separation region 24, the second separation region 25, and the planarizing film 30. Such a fixed charge film has a function of fixing a charge (here, a hole) to an interface between the photodiode PD and the first separation region 24, the second separation region 25, and the planarizing film 30.

As the material of the fixed charge film, it is preferable to use a high dielectric material having a lot of fixed charges. The fixed charge film is made of, for example, hafnium oxide ($HfO_2$), aluminum oxide ($Al_2O_3$), tantalum oxide, zirconium oxide ($ZrO_2$), titanium oxide, magnesium oxide ($MgO_2$), lanthanum oxide ($La_2O_3$), or the like.

The fixed charge film may be made of praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), or the like.

The fixed charge film may be made of gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), or the like.

The fixed charge film may be made of ytterbium oxide ($Yb_2O_3$), lutetium oxide ($Lu_2O_3$), yttrium oxide ($Y_2O_3$), aluminum nitride (AlN), hafnium oxynitride (HfON), an aluminum oxynitride film (AlON), or the like.

The color filter 40 is an optical filter that transmits light in a predetermined wavelength region in the incident light L and is provided between the on-chip lens 50 and the planarizing film 30.

The on-chip lens 50 is provided on a side where the light L is made incident on the semiconductor layer 20 and has a function of condensing the light L toward the light receiving pixel 11 corresponding to the on-chip lens 50. The on-chip lens 50 is made of, for example, an organic material, silicon oxide, or the like.

In the first embodiment, as illustrated in FIG. 4 and FIG. 5, one on-chip lens 50 is provided for each one light receiving pixel 11 (that is, one on-chip lens 50 is provided for each pair of photodiodes PD). Consequently, the light receiving pixel 11 functions as the phase difference detection pixel.

Various Modifications of the First Embodiment

Subsequently, various modifications of the first embodiment are explained with reference to FIG. 7 to FIG. 23.

<Modification 1>

Figure 7:
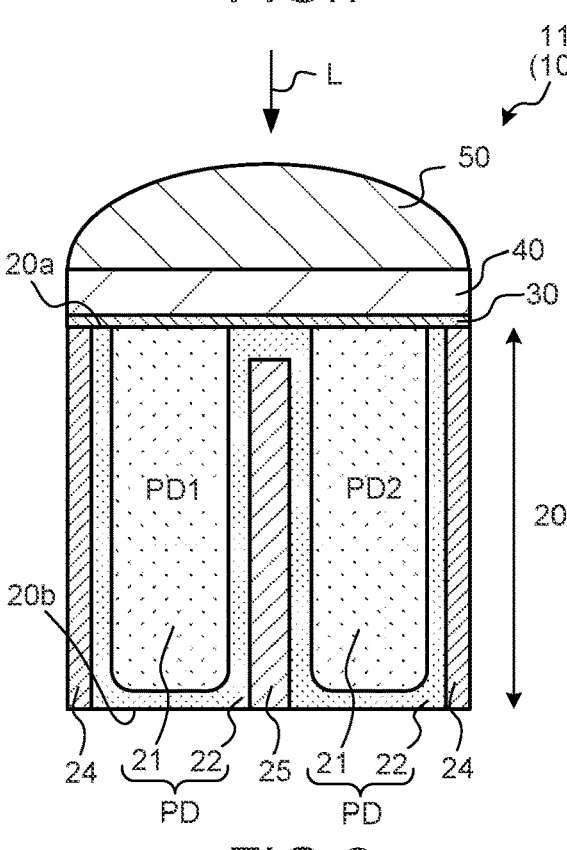
FIG. 7 is a sectional view illustrating an example of a configuration of the light receiving pixel according to a modification 1 of the first embodiment of the present disclosure.

FIG. 7 is a sectional view illustrating an example of a configuration of the light receiving pixel 11 according to a modification 1 of the first embodiment of the present disclosure and is a view corresponding to FIG. 4 in the first embodiment. As illustrated in FIG. 7, in the modification 1 of the first embodiment, the second separation region 25 is provided from the surface 20b on the opposite side to the light incident surface 20a of the semiconductor layer 20 to halfway in the semiconductor layer 20 (that is, not to pierce through the semiconductor layer 20).

Consequently, as in the first embodiment explained above, the second impurity region 22 can be formed not only in the bottom but also on the side of the first impurity region 21. This is because, in a process for forming the first separation region 24 and the second separation region 25, the impurity of the second conduction type can also be diffused from sidewalls of trenches formed in parts corresponding to the first separation region 24 and the second separation region 25.

Therefore, according to the modification 1 in the first embodiment, since the area of the PN junction surfaces of the photodiodes PD can be enlarged, the saturation signal charge amount of the photodiodes PD can be further increased.

In the modification 1, as in the first embodiment, the second impurity region 22a (see FIG. 5) can also be formed at the corner C1 (see FIG. 3) and the corner C3 (see FIG. 3).

Consequently, it is possible to form the overflow path connecting the pair of photodiodes PD without separately cutting out a part of the second separation region 25 to form the second impurity region. Therefore, according to the modification 1 of the first embodiment, it is possible to further increase the saturation signal charge amount of the photodiodes PD in the phase difference detection pixel.

Further, in this modification 1, it is possible to omit a process for separately cutting out a part of the second separation region 25 to form the second impurity region. Therefore, according to the modification 1 of the first embodiment, since it is possible to simplify the manufacturing process for the pixel array unit 10, it is possible to reduce the manufacturing cost of the solid-state imaging element 1.

In the modification 1, as illustrated in FIG. 7, since second impurity region 22 is disposed on the light incident surface 20a side of the second separation region 25, it is possible to cause the second impurity region 22 to also function as the overflow path connecting the pair of photodiodes PD.

Therefore, according to the modification 1 of the first embodiment, it is possible to cause the light receiving pixel 11 to more satisfactorily function as the phase difference detection pixel.

<Modification 2>

Figure 8:
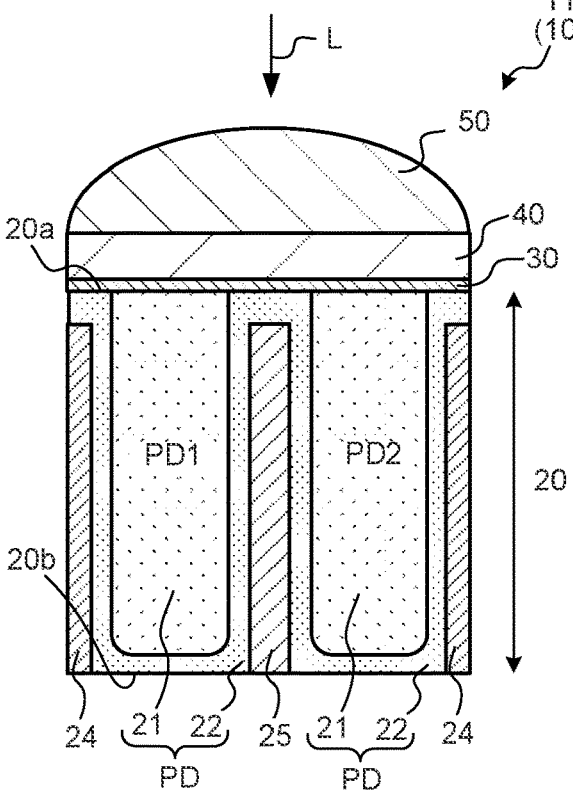
FIG. 8 is a sectional view illustrating an example of a configuration of the light receiving pixel according to a modification 2 of the first embodiment of the present disclosure.

FIG. 8 is a sectional view illustrating an example of a configuration of the light receiving pixel 11 according to a modification 2 of the first embodiment of the present disclosure. As illustrated in FIG. 8, in the modification 2 of the first embodiment, the first separation region 24 and the second separation region 25 are provided from the surface 20b on the opposite side to the light incident surface 20a of the semiconductor layer 20 to halfway in the semiconductor layer 20 (that is, not to pierce through the semiconductor layer 20).

Consequently, as in the first embodiment explained above, the second impurity region 22 can be formed not only in the bottom but also on the side of the first impurity region 21. This is because, in a process for forming the first separation region 24 and the second separation region 25, the impurity of the second conduction type can also be diffused from sidewalls of trenches formed in parts corresponding to the first separation region 24 and the second separation region 25.

Therefore, according to the modification 2 of the first embodiment, since the area of the PN junction surfaces of the photodiodes PD can be enlarged, it is possible to further increase the saturation signal charge amount of the photodiodes PD.

In the modification 2, as in the first embodiment, the second impurity region 22a (see FIG. 5) can also be formed at the corner C1 (see FIG. 3) and the corner C3 (see FIG. 3).

Consequently, it is possible to form the overflow path connecting the pair of photodiodes PD without separately cutting out a part of the second separation region 25 to form the second impurity region. Therefore, according to the modification 2 of the first embodiment, it is possible to further increase the saturation signal charge amount of the photodiodes PD in the phase difference detection pixel.

In this modification 2, it is possible to omit a process for separately cutting out a part of the second separation region 25 to form the second impurity region. Therefore, according to the modification 2 of the first embodiment, since the manufacturing process for the pixel array unit 10 can be simplified, it is possible to reduce the manufacturing cost for the solid-state imaging element 1.

In the modification 2, as illustrated in FIG. 8, since the second impurity region 22 is disposed on the light incident surface 20a side of the second separation region 25, it is possible to cause the second impurity region 22 to also function as the overflow path connecting the pair of photodiodes PD.

Therefore, according to the modification 2 of the first embodiment, it is possible to cause the light receiving pixel 11 to more satisfactorily function as the phase difference detection pixel.

<Modifications 3 to 5>

Figure 9:
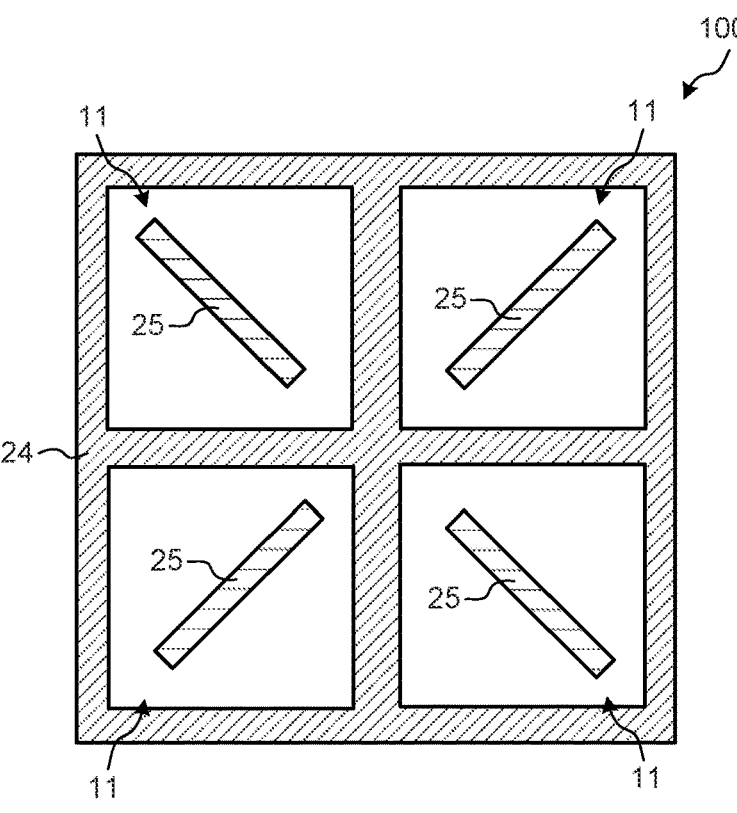
FIG. 9 is a plan view illustrating an example of a configuration of the light receiving pixel group according to a modification 3 of the first embodiment of the present disclosure.
Figure 10:
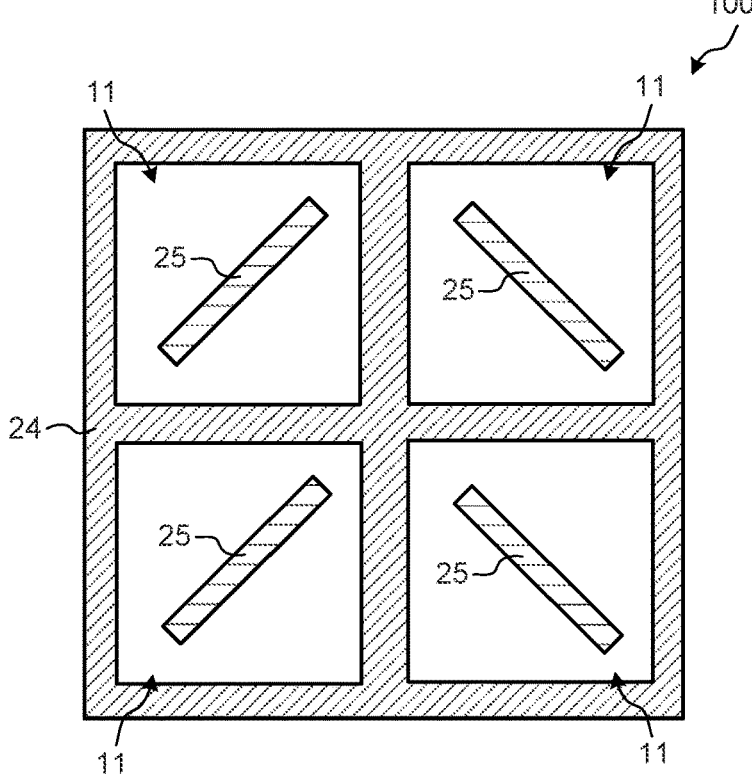
FIG. 10 is a plan view illustrating an example of a configuration of the light receiving pixel group according to a modification 4 of the first embodiment of the present disclosure.
Figure 11:
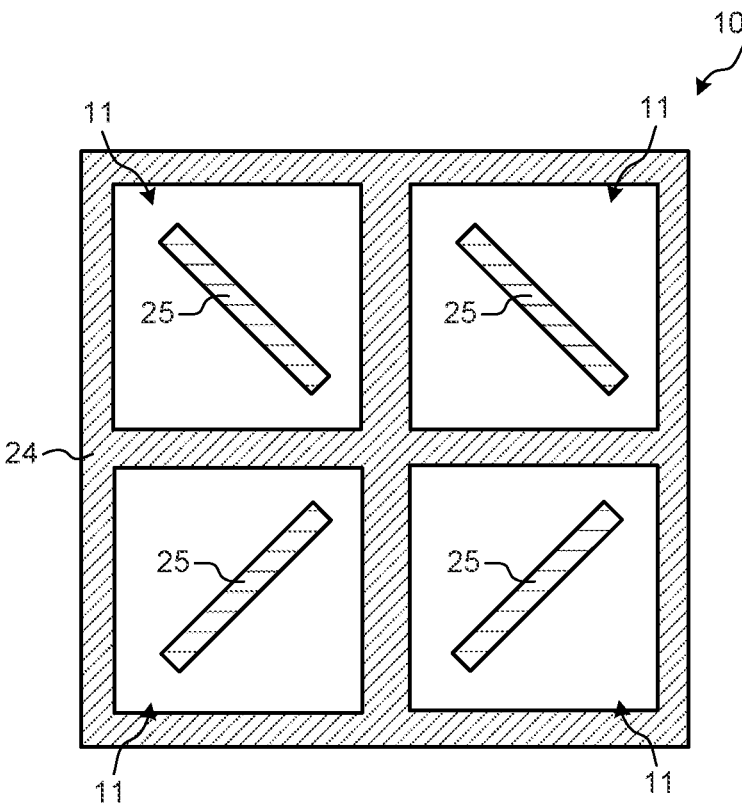
FIG. 11 is a plan view illustrating an example of a configuration of the light receiving pixel group according to a modification 5 of the first embodiment of the present disclosure.

FIG. 9 to FIG. 11 are plan views illustrating examples of the configuration of the light receiving pixel group 100 according to modifications 3 to 5 of the first embodiment of the present disclosure. Note that, in FIG. 9 to FIG. 11, to facilitate understanding, illustration of elements other than the first separation region 24 and the second separation region 25 is omitted in the light receiving pixel 11.

FIG. 6 in the first embodiment explained above illustrates an example in which all the second separation regions 25 face the same direction in the plurality of light receiving pixels 11 included in the same light receiving pixel group 100. However, the present disclosure is not limited to such an example.

For example, as illustrated in FIG. 9, in the four light receiving pixels 11 arranged in two rows and two columns in plan view, the second separation regions 25 of the upper right and lower left light receiving pixels 11 may face the same direction and the second separation regions 25 of the upper left and lower right light receiving pixels 11 may face another same direction.

As explained above, in the plurality of light receiving pixels 11 included in the same light receiving pixel group 100, since the light receiving pixels 11 include the second separation regions 25 facing different directions each other, it is possible to detect phase differences in various directions.

Therefore, according to the modification 3 of the first embodiment, it is possible to cause the light receiving pixel 11 to more satisfactorily function as the phase difference detection pixel.

As illustrated in FIG. 10, in the four light receiving pixels 11 arranged in two rows and two columns in plan view, the second separation regions 25 of the upper right and lower right light receiving pixels 11 may face the same direction and the second separation regions 25 of the upper left and lower left light receiving pixels 11 may face another same direction.

Consequently, since phase differences in various directions can also be detected, it is possible to cause the light receiving pixel 11 to more satisfactorily function as the phase difference detection pixel.

As illustrated in FIG. 11, in the four light receiving pixels 11 arranged in two rows and two columns in plan view, the second separation regions 25 of the upper right and upper left light receiving pixels 11 may face the same direction and the second separation regions 25 of the lower right and lower left light receiving pixels 11 may face another same direction.

Consequently, since phase differences in various directions can also be detected, it is possible to cause the light receiving pixel 11 to more satisfactorily function as the phase difference detection pixel.

<Modification 6>

Figure 12:
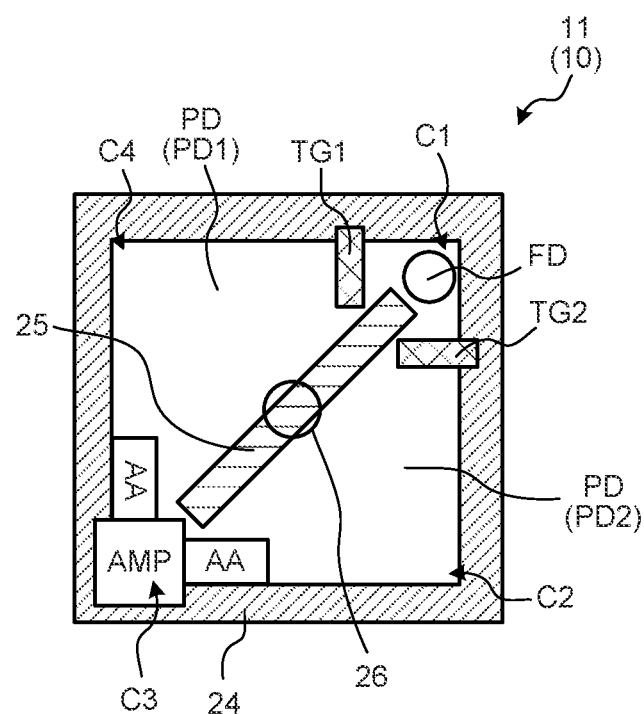
FIG. 12 is a plan view illustrating an example of a configuration of the light receiving pixel according to a modification 6 of the first embodiment of the present disclosure.

FIG. 12 is a plan view illustrating an example of a configuration of the light receiving pixel 11 according to a modification 6 of the first embodiment of the present disclosure and is a view corresponding to FIG. 3 in the first embodiment. As illustrated in FIG. 12, in the modification 6 of the first embodiment, the contact region 26 partially overlaps the second separation region 25 in plan view.

Consequently, since both the photodiodes PD can be connected to the ground potential in one contact region 26, it is possible to improve the layout efficiency of the pixel array unit 10.

<Modification 7>

Figure 13:
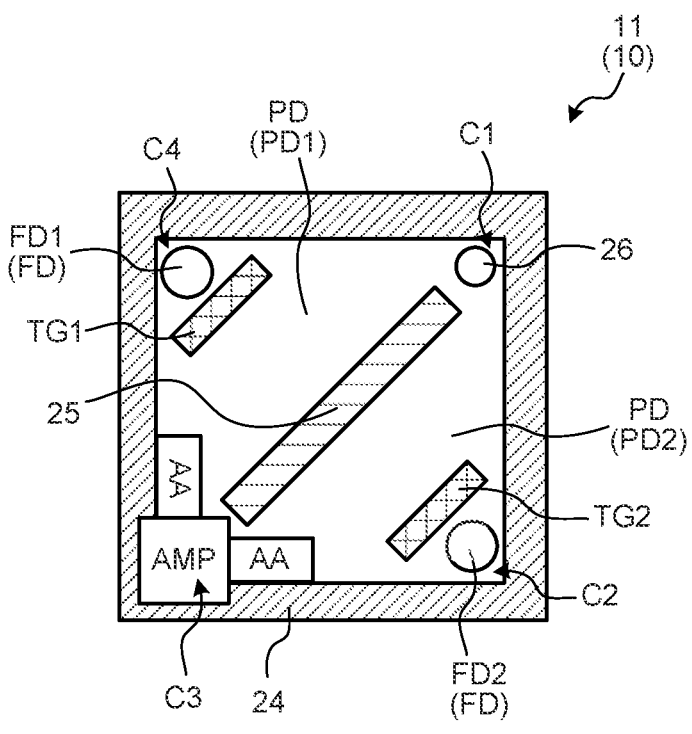
FIG. 13 is a plan view illustrating an example of a configuration of the light receiving pixel according to a modification 7 of the first embodiment of the present disclosure.

FIG. 13 is a plan view illustrating an example of a configuration of the light receiving pixel 11 according to a modification 7 of the first embodiment of the present disclosure. As illustrated in FIG. 13, in the modification 7 of the first embodiment, a pair of floating diffusions FD is respectively provided in the pair of photodiodes PD.

Specifically, a floating diffusion FD1 corresponding to the photodiode PD1 is disposed at the corner C4 in plan view and a floating diffusion FD2 corresponding to the photodiode PD2 is disposed at the corner C2 in plan view.

Note that, since the floating diffusions FD1 and FD2 are electrically connected via a not-illustrated wiring layer, the photodiodes PD1 and PD2 share the floating diffusions FD.

The contact region 26 is disposed at the corner C1 of the light receiving pixel 11 where the floating diffusion FD is disposed in the first embodiment explained above.

In the modification 7 of the first embodiment, since the light receiving pixel 11 has such a planar configuration, the floating diffusion FD, the contact region 26, and the pixel transistor can be efficiently disposed. Therefore, according to the modification 7 of the first embodiment, it is possible to improve the layout efficiency of the pixel array unit 10.

<Modification 8>

Figure 14:
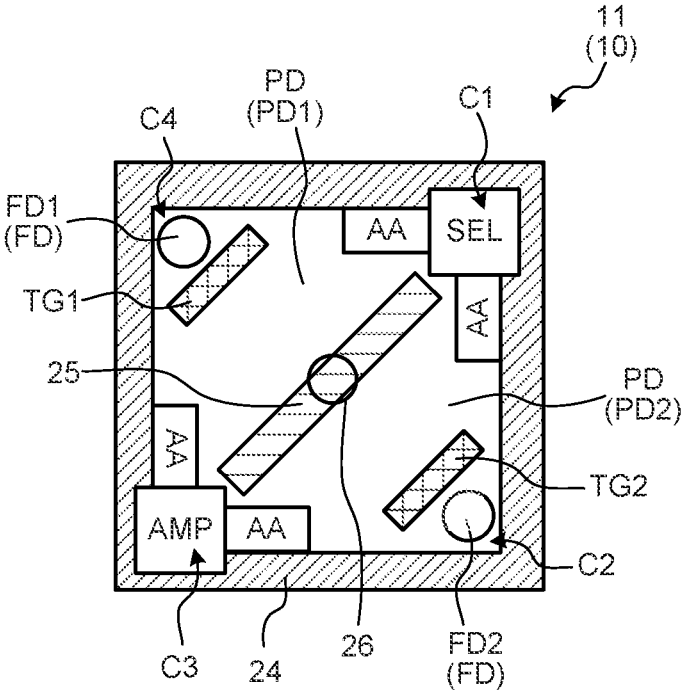
FIG. 14 is a plan view illustrating an example of a configuration of the light receiving pixel according to a modification 8 of the first embodiment of the present disclosure.

FIG. 14 is a plan view illustrating an example of a configuration of the light receiving pixel 11 according to a modification 8 of the first embodiment of the present disclosure. As illustrated in FIG. 14, in the modification 8 of the first embodiment, a pair of floating diffusions FD is respectively provided in a pair of photodiodes PD as in the modification 7 explained above.

In this modification 8, the contact region 26 is provided to overlap the second separation region 25 in plan view. Another pixel transistor (for example, the selection transistor SEL) and the active region AA of the pixel transistor are disposed at the corner C1 of the light receiving pixel 11 where the contact region 26 is disposed in the modification 7 explained above.

In the modification 8 of the first embodiment, since the light receiving pixel 11 has such a planar configuration, the floating diffusion FD, the contact region 26, and the two pixel transistors can be efficiently disposed. Therefore, according to the modification 8 of the first embodiment, it is possible to improve the layout efficiency of the pixel array unit 10.

Figure 15:
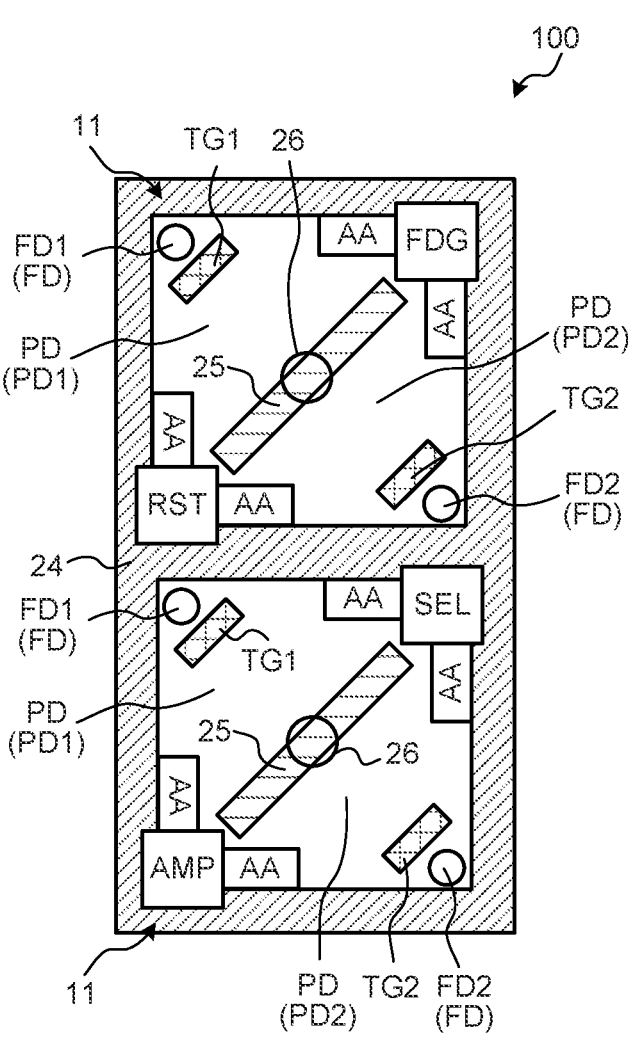
FIG. 15 is a plan view illustrating an example of a configuration of the light receiving pixel group according to a modification 8 of the first embodiment of the present disclosure.

Note that the pixel transistors disposed at the corners C1 and C3 are not limited to the amplification transistor AMP and the selection transistor SEL. FIG. 15 is a plan view illustrating an example of a configuration of the light receiving pixel group 100 according to the modification 8 of the first embodiment of the present disclosure.

As illustrated in FIG. 15, in this modification 8, for example, one light receiving pixel group 100 is constituted by two light receiving pixels 11 vertically arranged in plan view. The two light receiving pixels 11 included in the one light receiving pixel group 100 share one read circuit 18 (see FIG. 2).

The example illustrated in FIG. 15, in the one light receiving pixel group 100, the switching transistor FDG is disposed at the corner C1 (see FIG. 14) of one (for example, upper) light receiving pixel 11 and the reset transistor RST is disposed at the corner C3.

In the one light receiving pixel group 100, the selection transistor SEL is disposed at the corner C1 of another (for example, lower) light receiving pixel 11 and the amplification transistor AMP is disposed at the corner C3.

As explained above, in the modification 8 in the first embodiment, various types of pixel transistors may be disposed at the corners C1 and C3 of the plurality of light receiving pixels 11 in a so-called 2×2 shared light receiving pixel group 100. Consequently, it is possible to further improve the layout efficiency of the pixel array unit 10.

Figure 16:
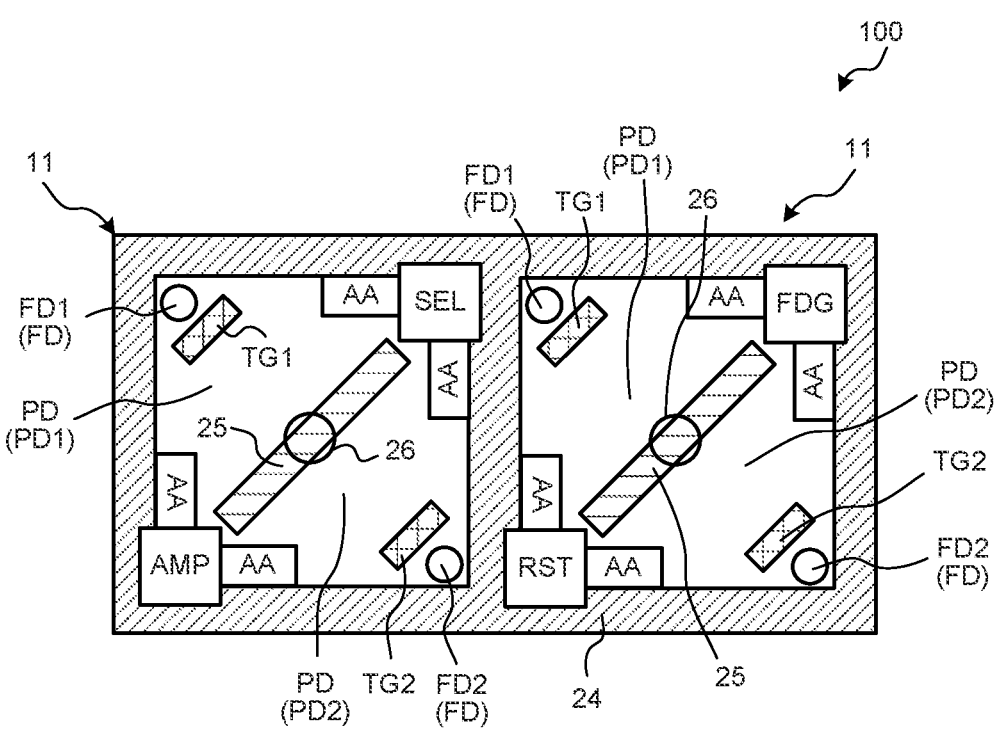
FIG. 16 is a plan view illustrating another example of the configuration of the light receiving pixel group according to the modification 8 of the first embodiment of the present disclosure.

FIG. 16 is a plan view illustrating another example of the configuration of the light receiving pixel group 100 according to the modification 8 of the first embodiment of the present disclosure. As illustrated in FIG. 16, in this modification 8, for example, one light receiving pixel group 100 may be configured by two light receiving pixels 11 horizontally arranged in plan view.

In this modification 8, in the one light receiving pixel group 100, the switching transistor FDG is disposed at the corner C1 (see FIG. 14) of one (for example, right) light receiving pixel 11 and the reset transistor RST is disposed at the corner C3.

In the one light receiving pixel group 100, the selection transistor SEL is disposed at the corner C1 of another (for example, left) light receiving pixel 11 and the amplification transistor AMP is disposed at the corner C3.

As explained above, in the modification 8 of the first embodiment, various types of pixel transistors may be disposed at the corners C1 and C3 of the plurality of light receiving pixels 11 in a so-called 4×1 shared light receiving pixel group 100. Consequently, it is possible to further improve the layout efficiency of the pixel array unit 10.

<Modification 9>

Figure 17:
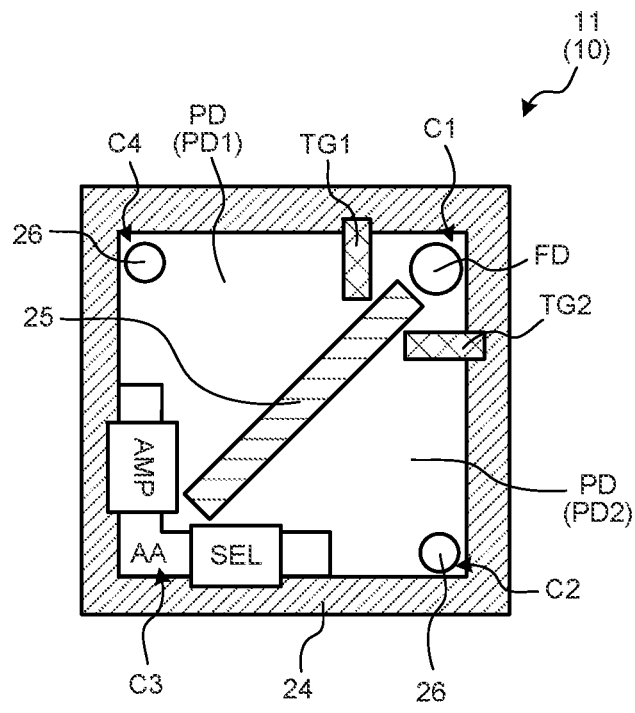
FIG. 17 is a plan view illustrating an example of a configuration of the light receiving pixel according to a modification 9 of the first embodiment of the present disclosure.

FIG. 17 is a plan view illustrating an example of a configuration of the light receiving pixel 11 according to a modification 9 of the first embodiment of the present disclosure. As illustrated in FIG. 17, in the modification 9 of the first embodiment, a disposition form of a pixel transistor provided at the corner C3 is different from the disposition form in the first embodiment explained above (FIG. 3).

Specifically, the active region AA having a substantially L-shape in plan view is disposed along the corner C3 and different pixel transistors (for example, the amplification transistor AMP and the selection transistor SEL) are respectively disposed on two sides of the active region AA.

In the modification 9 of the first embodiment, since the light receiving pixel 11 has such a planar configuration, the floating diffusion FD, the contact region 26, and the pixel transistor can be more efficiently disposed. Therefore, according to the modification 9 of the first embodiment, it is possible to further improve the layout efficiency of the pixel array unit 10.

In the modification 9, by disposing the substantially L-shaped active region AA in the light receiving pixel 11, the area of the active region AA can be secured large. Therefore, according to the modification 9 of the first embodiment, it is possible to further improve the layout efficiency of the pixel array unit 10.

Figure 18:
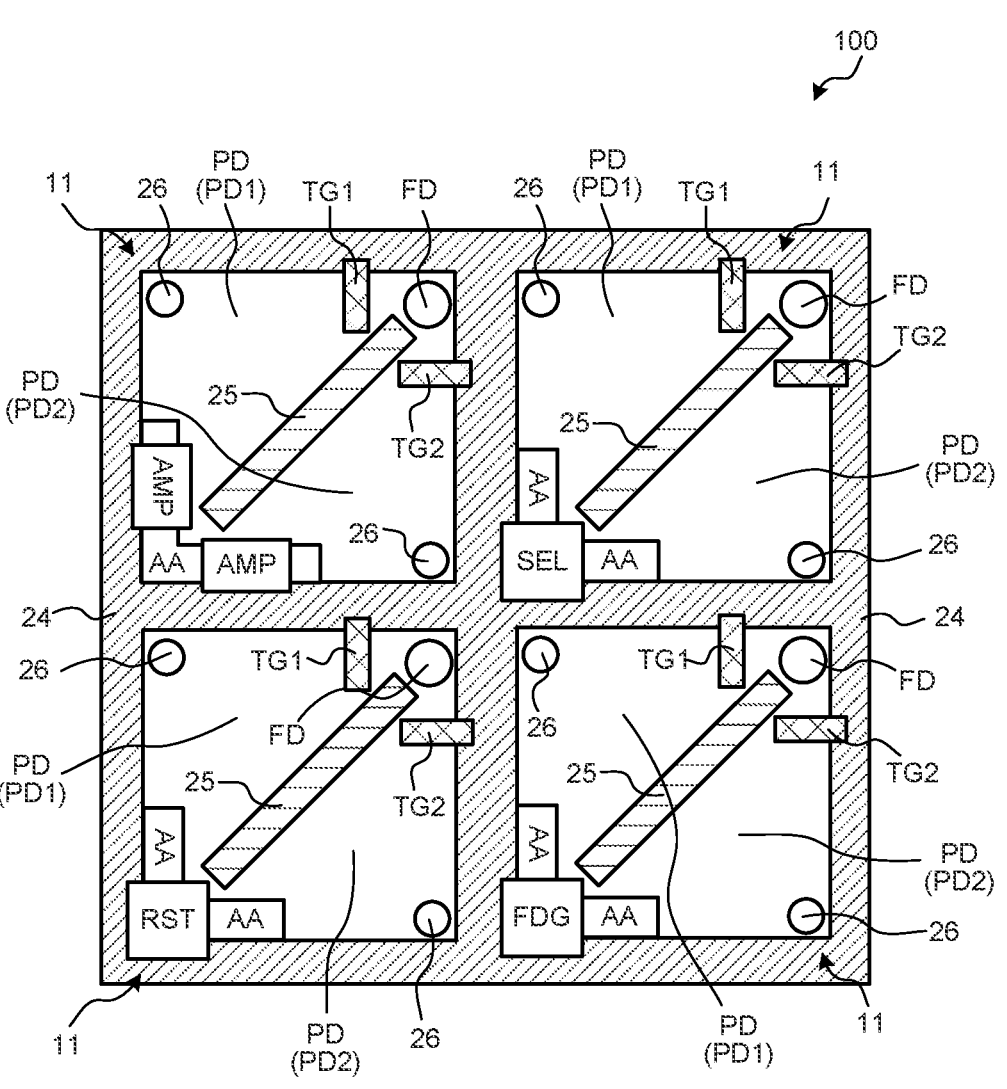
FIG. 18 is a plan view illustrating an example of a configuration of the light receiving pixel group according to the modification 9 of the first embodiment of the present disclosure.

Note that the pixel transistor disposed at the corner C3 is not limited to the amplification transistor AMP and the selection transistor SEL. FIG. 18 is a plan view illustrating an example of a configuration of the light receiving pixel group 100 according to the modification 9 of the first embodiment of the present disclosure.

As illustrated in FIG. 18, in the modification 9, for example, the one light receiving pixel group 100 is configured by four light receiving pixels 11 arranged in two rows and two columns in plan view. The four light receiving pixels 11 included in the one light receiving pixel group 100 share one read circuit 18 (see FIG. 2).

In this modification 9, in the one light receiving pixel group 100, two amplification transistors AMP are disposed at the corner C3 (see FIG. 17) of one (for example, upper left) light receiving pixel 11 and the selection transistor SEL is disposed at the corner C3 of one (for example, upper right) light receiving pixel 11.

In the one light receiving pixel group 100, the reset transistor RST is disposed at the corner C3 of one (for example, lower left) light receiving pixel 11 and the switching transistor FDG is disposed at the corner C3 of one (for example, lower right) light receiving pixel 11.

As explained above, in the modification 9 of the first embodiment, various types of pixel transistors may be disposed at the corners C3 of the plurality of light receiving pixels 11 in a so-called 4×2 shared light receiving pixel group 100. Consequently, it is possible to further improve the layout efficiency of the pixel array unit 10.

In the modification 9 of the first embodiment, a plurality of (two in FIG. 18) amplification transistors AMP connected in parallel can be provided in the read circuit 18 shared by one light receiving pixel group 100. Consequently, it is possible to improve random noise of the read circuit 18.

Figure 19:
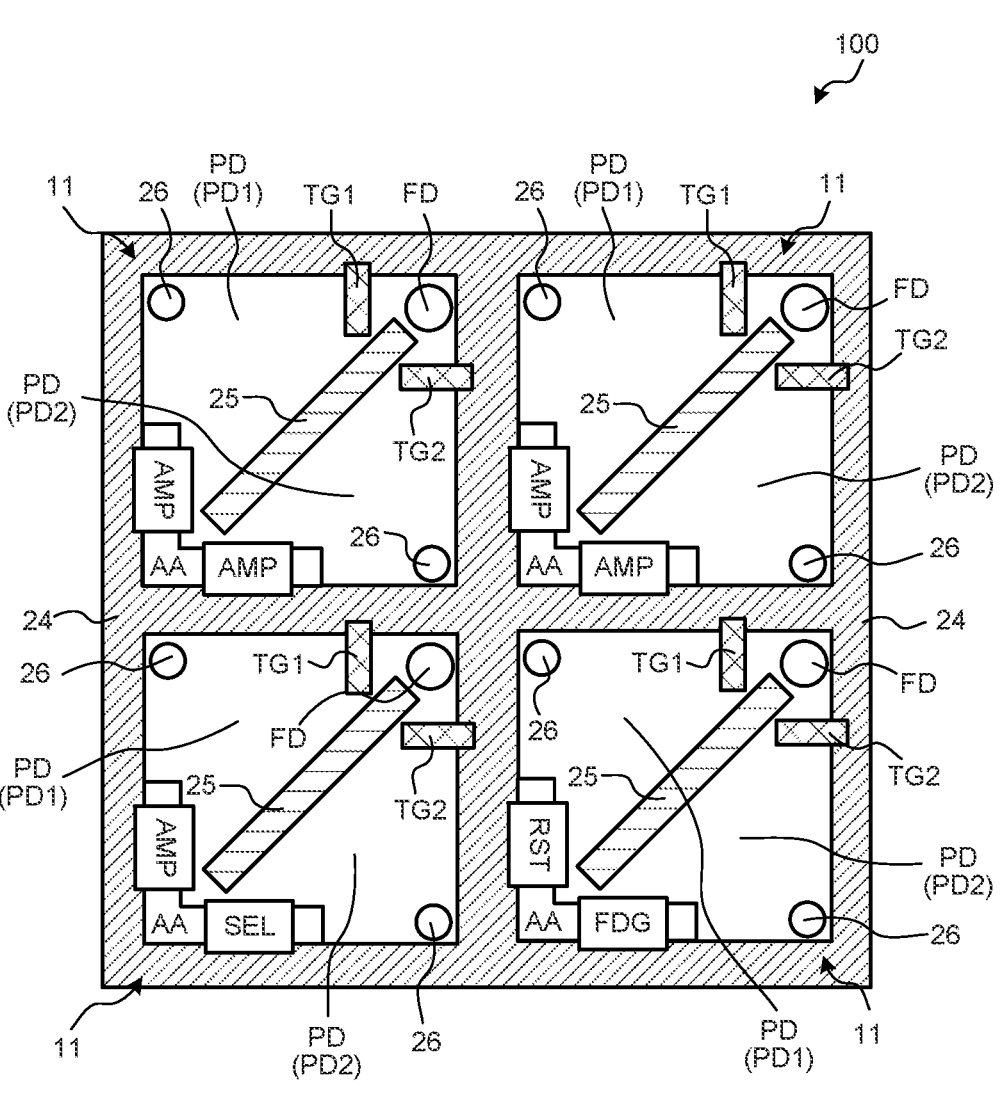
FIG. 19 is a plan view illustrating another example of the configuration of the light receiving pixel group according to the modification 9 of the first embodiment of the present disclosure.

FIG. 19 is a plan view illustrating another example of the configuration of the light receiving pixel group 100 according to the modification 9 of the first embodiment of the present disclosure.

In the example illustrated in FIG. 19, in one light receiving pixel group 100, two amplification transistors AMP are disposed at the corner C3 (see FIG. 17) of one (for example, upper left) light receiving pixel 11 and two amplification transistors AMP are disposed at the corner C3 of one (for example, upper right) light receiving pixel 11.

In one light receiving pixel group 100, the amplification transistor AMP and the selection transistor SEL are disposed at the corner C3 of one (for example, lower left) light receiving pixel 11. In the one light receiving pixel group 100, the reset transistor RST and the switching transistor FDG are disposed at the corner C3 of one (for example, lower right) light receiving pixel 11.

As explained above, in the modification 9 of the first embodiment, various pixel transistors may be disposed at the corners C3 of the plurality of light receiving pixels 11 in a so-called 4×2 shared light receiving pixel group 100. Consequently, it is also possible to further improve the layout efficiency of the pixel array unit 10.

In the example illustrated in FIG. 19, five amplification transistors AMP connected in parallel can be provided in the read circuit 18 (see FIG. 2) shared by the one light receiving pixel group 100. Consequently, it is possible to improve random noise of the read circuit 18.

<Modification 10>

Figure 20:
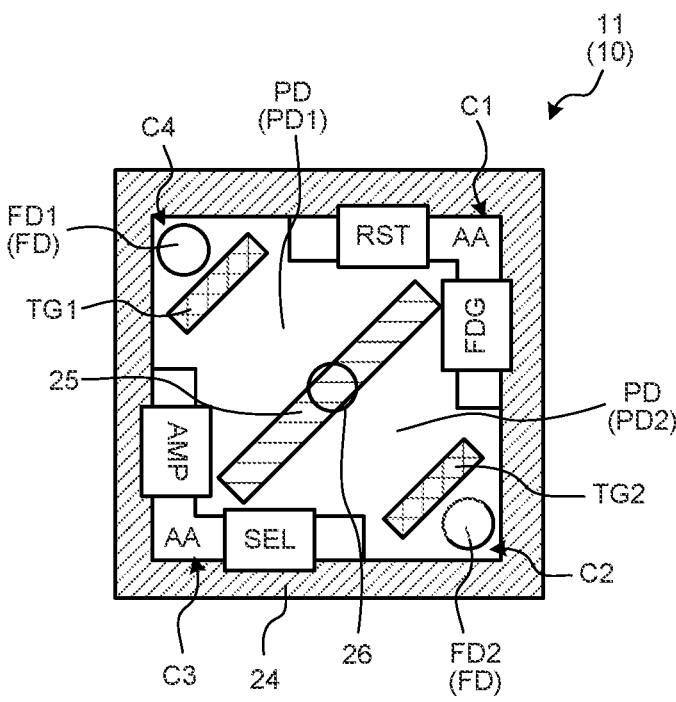
FIG. 20 is a plan view illustrating an example of a configuration of the light receiving pixel according to a modification 10 of the first embodiment of the present disclosure.

FIG. 20 is a plan view illustrating an example of a configuration of the light receiving pixel 11 according to a modification 10 in the first embodiment of the present disclosure. As illustrated in FIG. 20, in the modification 10 of the first embodiment, as in the modification 8 explained above, a pair of floating diffusions FD is respectively provided in a pair of photodiodes PD and the contact region 26 is provided to overlap the second separation region 25 in plan view.

The substantially L-shaped active region AA is disposed along the corner C1 and different pixel transistors (for example, the reset transistor RST and the switching transistor FDG) are disposed on two sides of the active region AA.

Further, the substantially L-shaped active region AA is disposed along the corner C3 and different pixel transistors (for example, the amplification transistor AMP and the selection transistor SEL) are disposed on two sides of the active region AA.

In the modification 10 of the first embodiment, since the light receiving pixel 11 has such a planar configuration, the floating diffusion FD, the contact region 26, and the pixel transistor can be more efficiently disposed. Therefore, according to the modification 10 of the first embodiment, it is possible to further improve the layout efficiency of the pixel array unit 10.

Figure 21:
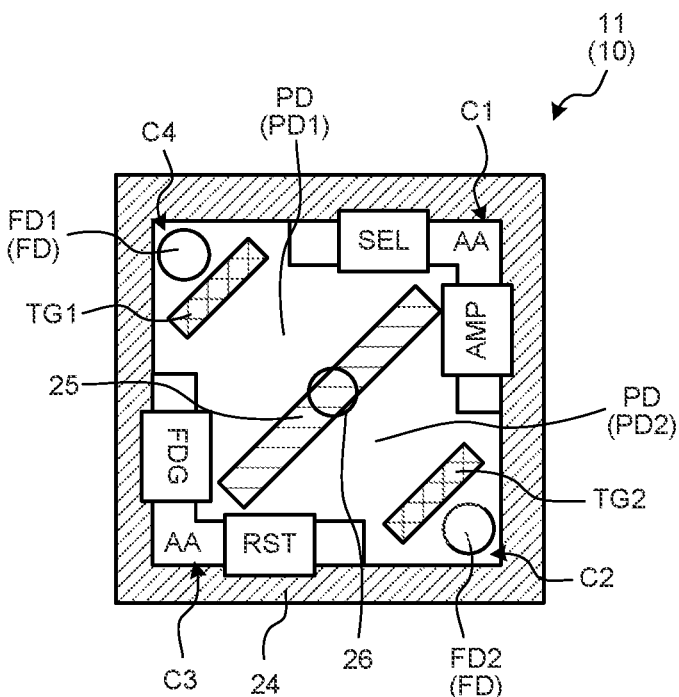
FIG. 21 is a plan view illustrating another example of the configuration of the light receiving pixel according to the modification 10 of the first embodiment of the present disclosure.

Note that the disposition of the pixel transistors in the light receiving pixel 11 is not limited to the example illustrated in FIG. 20. FIG. 21 is a plan view illustrating another example of the configuration of the light receiving pixel 11 according to the modification 10 of the first embodiment of the present disclosure.

In the example illustrated in FIG. 21, the substantially L-shaped active region AA is disposed along the corner C1 and different pixel transistors (for example, the amplification transistor AMP and the selection transistor SEL) are respectively disposed on two sides of the active region AA.

The substantially L-shaped active region AA is disposed along the corner C3 and different pixel transistors (for example, the reset transistor RST and the switching transistor FDG) are disposed on two sides of the active region AA.

In the modification 10 of the first embodiment, when the light receiving pixel 11 has such a planar configuration, the floating diffusion FD, the contact region 26, and the pixel transistor can be more efficiently disposed. Therefore, according to the modification 10 of the first embodiment, it is possible to further improve the layout efficiency of the pixel array unit 10.

In the modification 10, by disposing the substantially L-shaped active region AA in the light receiving pixel 11, the area of the active region AA can be secured large. Therefore, according to the modification 10 of the first embodiment, it is possible to further improve the layout efficiency of the pixel array unit 10.

In this modification 10, as illustrated in FIG. 20 and FIG. 21, a combination of the amplification transistor AMP and the selection transistor SEL or a combination of the reset transistor RST and the switching transistor FDG may be disposed with respect to one active region AA. Consequently, it is possible to further improve the layout efficiency of the pixel array unit 10.

<Modification 11>

Figure 22:
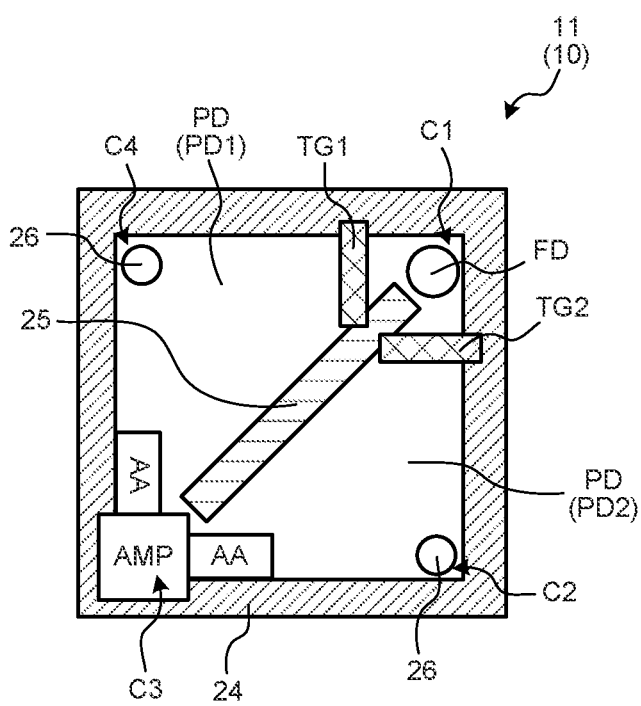
FIG. 22 is a plan view illustrating an example of a configuration of the light receiving pixel according to a modification 11 of the first embodiment of the present disclosure.

FIG. 22 is a plan view illustrating an example of a configuration of the light receiving pixel 11 according to a modification 11 of the first embodiment of the present disclosure. In the modification 11 of the first embodiment, the disposition of the transfer gates TG1 and TG2 is different from the disposition in the first embodiment explained above (FIG. 3).

Specifically, as illustrated in FIG. 22, a part of the transfer gates TG1 and TG2 overlaps the second separation region 25 in plan view. Consequently, it is also possible to further improve the layout efficiency of the pixel array unit 10.

<Modification 12>

Figure 23:
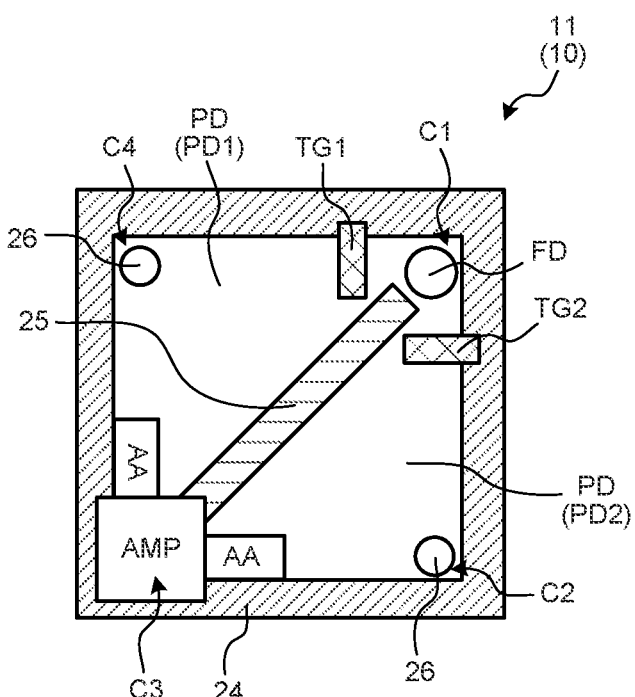
FIG. 23 is a plan view illustrating an example of a configuration of the light receiving pixel according to a modification 12 of the first embodiment of the present disclosure.

FIG. 23 is a plan view illustrating an example of a configuration of the light receiving pixel 11 according to a modification 12 of the first embodiment of the present disclosure. In the modification 12 of the first embodiment, the disposition of a pixel transistor is different from the disposition in the first embodiment explained above (FIG. 3).

Specifically, as illustrated in FIG. 23, a part of the pixel transistor (here, the amplification transistor AMP) overlaps the second separation region 25 in plan view. Consequently, it is also possible to further improve the layout efficiency of the pixel array unit 10.

Second Embodiment

In recent years, in a back-illuminated CMOS image sensor, there has been a technology for making light incident on four photodiodes from the same on-chip lens to realize detection of a phase difference. In such an image sensor, a dynamic range and an SN ratio can be improved by increasing a saturation signal charge amount of the photodiodes.

However, in the related art explained above, it is necessary to form a separation region among four photodiodes that detect a phase difference and it is also necessary to form an overflow path in the separation region. Therefore, the volume of the photodiodes themselves sometimes cannot be sufficiently secured.

That is, in the related art explained above, there is room for further improvement in that the saturation signal charge amount of the photodiode is increased in the phase difference detection pixel.

Therefore, it is expected to realize a technology that can overcome the problems described above and increase the saturation signal charge amount of the photodiodes in the phase difference detection pixel having four photodiodes.

Pixel Circuit of a Second Embodiment

Figure 24:
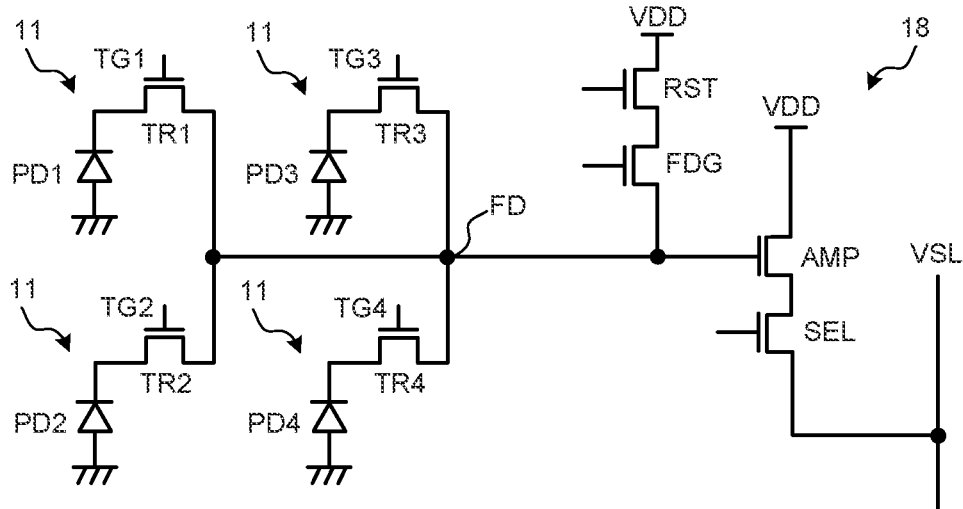
FIG. 24 is a diagram illustrating an example of a pixel circuit according to a second embodiment of the present disclosure.

First, an example of a pixel circuit according to a second embodiment is explained with reference to FIG. 24. FIG. 24 is a diagram illustrating the example of the pixel circuit according to the second embodiment of the present disclosure.

As illustrated in FIG. 24, in the second embodiment, four light receiving pixels 11 share one read circuit 18. Here, "share" means that the four light receiving pixels 11 are electrically connected to a common read circuit 18, that is, outputs of the four light receiving pixels 11 are input to the common read circuit 18.

The light receiving pixels 11 includes common component each other. In FIG. 24, in order to distinguish the components of the light receiving pixels 11 from one another, identification numbers (1, 2, 3, and 4) are added to the ends of signs of the components of the light receiving pixels 11.

In the present disclosure, when it is necessary to distinguish the components of the light receiving pixels 11 from each other, identification numbers are added to the ends of the signs of the components of the light receiving pixels 11. On the other hand, in the present disclosure, when it is unnecessary to distinguish the components of the light receiving pixels 11 from each other, the identification numbers at the ends of the signs of the components of the light receiving pixels 11 are omitted.

The light receiving pixels 11 respectively include, for example, photodiodes PD and transfer transistors TR electrically connected to the photodiodes PD. The photodiodes PD are an example of a photoelectric conversion unit.

These light receiving pixels 11 share a floating diffusion FD electrically connected to the transfer transistors TR. Here, "share" means that the individual photodiodes PD of the light receiving pixels 11 are electrically connected to the floating diffusion FD.

The photodiodes PD perform photoelectric conversion to generate charges corresponding to amounts of received light. Cathodes of the photodiodes PD are electrically connected to sources of the transfer transistors TR and anodes of the photodiodes PD are electrically connected to a reference potential line (for example, the ground potential).

Drains of the transfer transistors TR are electrically connected to the floating diffusion FD and transfer gates TG, which are gates of the transfer transistors TR, are electrically connected to the pixel drive line LD (see FIG. 1). The transfer transistors TR are, for example, CMOS transistors.

The floating diffusion FD is common to the light receiving pixels 11 that share one read circuit 18 and is electrically connected to an input end of the read circuit 18 common to the light receiving pixels 11. The floating diffusion FD temporarily holds charges output from the photodiodes PD via the transfer transistors TR.

As illustrated in FIG. 24, the read circuit 18 includes, for example, the reset transistor RST, the selection transistor SEL, the amplification transistor AMP, and the switching transistor FDG. The reset transistor RST, the amplification transistor AMP, the selection transistor SEL, and the switching transistor FDG are, for example, CMOS transistors. Note that the selection transistor SEL and the switching transistor FDG may be omitted according to necessity.

A source of the switching transistor FDG, which is an input unit of the read circuit 18, is electrically connected to the floating diffusion FD and a drain of the switching transistor FDG is electrically connected to a source of the reset transistor RST. A gate of the switching transistor FDG is electrically connected to the pixel drive line LD.

A drain of the reset transistor RST is electrically connected to a power supply voltage VDD and a gate of the reset transistor RST is electrically connected to the pixel drive line LD.

A source of the amplification transistor AMP is electrically connected to a drain of the selection transistor SEL and a drain of the amplification transistor AMP is electrically connected to the power supply voltage VDD. A gate of the amplification transistor AMP is electrically connected to the source of the switching transistor FDG and the floating diffusion FD.

A source of the selection transistor SEL, which is an output unit of the read circuit 18, is electrically connected to the vertical pixel wire LV and a gate of the selection transistor SEL is electrically connected to the pixel drive line LD.

When the transfer transistors TR are turned on, the transfer transistors TR transfer charges of the photodiodes PD to the floating diffusion FD.

The reset transistor RST resets the potential of the floating diffusion FD to predetermined potential. When the reset transistor RST is turned on, the reset transistor RST resets the potential of the floating diffusion FD to the potential of the power supply voltage VDD. The selection transistor SEL controls output timing of a pixel signal from the read circuit 18.

The amplification transistor AMP generates, as a pixel signal, a signal having a voltage corresponding to a level of a charge held in the floating diffusion FD. The amplification transistor AMP configures a source follower type amplifier and outputs a pixel signal having a voltage corresponding to a level of a charge generated in the photodiode PD.

When the selection transistor SEL is turned on, the amplification transistor AMP amplifies the potential of the floating diffusion FD and outputs a voltage corresponding to the potential to the column signal processing unit 15 (see FIG. 1) via the vertical pixel wire LV.

The switching transistor FDG is used to switch the conversion efficiency. Since the function of the switching transistor FDG is the same as the function in the first embodiment explained above, detailed explanation of the function is omitted.

Light Receiving Pixel in the Second Embodiment

Figure 25:
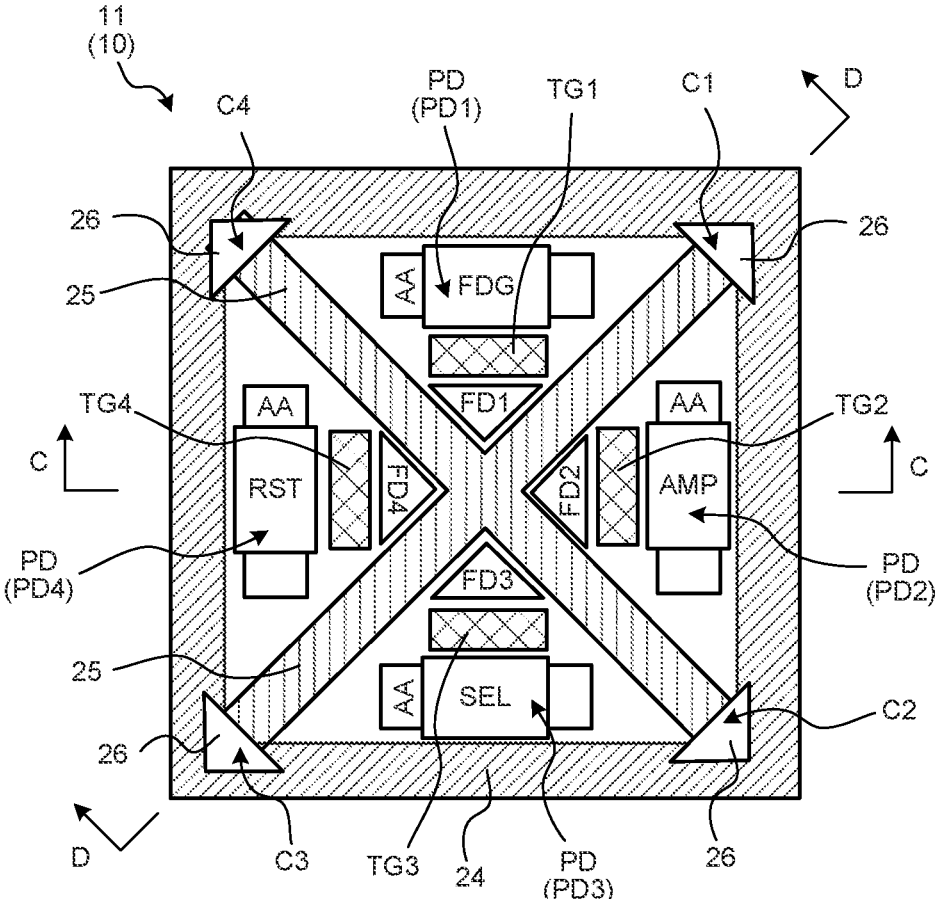
FIG. 25 is a plan view illustrating an example of a configuration of a light receiving pixel according to the second embodiment of the present disclosure.

Subsequently, a detailed configuration of the light receiving pixel 11 according to the second embodiment is explained with reference to FIG. 25 to FIG. 27. FIG. 25 is a plan view illustrating an example of a configuration of the light receiving pixel 11 according to the second embodiment of the present disclosure.

Figure 26:
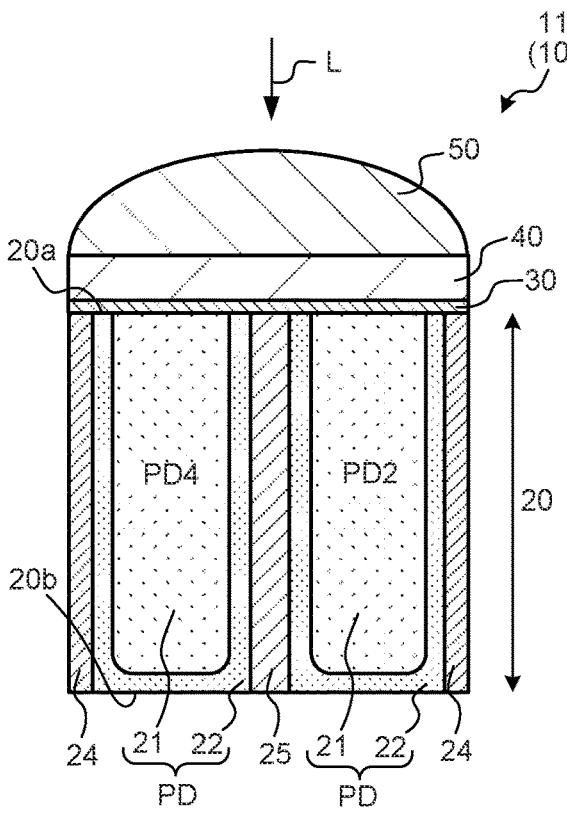
FIG. 26 is an arrow sectional view taken along line C-C illustrated in FIG. 25.

FIG. 26 is an arrow sectional view taken along line C-C illustrated in FIG. 25. FIG. 27 is an arrow sectional view taken along line D-D illustrated in FIG. 25. Note that illustration of the pixel transistor, the floating diffusion FD, and the like is omitted in the sectional views illustrated in FIG. 26 and FIG. 27.

As illustrated in FIG. 26 and the like, the pixel array unit 10 includes the semiconductor layer 20, the planarizing film 30, the color filter 40, and the on-chip lens 50.

The semiconductor layer 20 contains, for example, silicon. The semiconductor layer 20 includes a plurality of photodiodes PD. The photodiodes PD are an example of a photoelectric conversion unit. As illustrated in FIG. 25, four photodiodes PD1 to PD4 are provided in one light receiving pixel 11. Since the four photodiodes PD1 to PD4 are provided, the light receiving pixel 11 functions as a phase difference detection pixel.

The photodiode PD includes a first impurity region 21 containing impurities of a first conduction type (for example, N-type) and a second impurity region 22 containing impurities of a second conduction type (for example, P-type).

The first impurity region 21 is disposed in the center of the photodiode PD and the second impurity region 22 is disposed along a side and the bottom (a part on the opposite side to a side on which light L is made incident) of the first impurity region 21.

The light receiving pixel 11 includes a first separation region 24 and a second separation region 25. As illustrated in FIG. 25, the first separation region 24 is disposed to surround the four photodiodes PD in one light receiving pixel 11.

Figure 27:
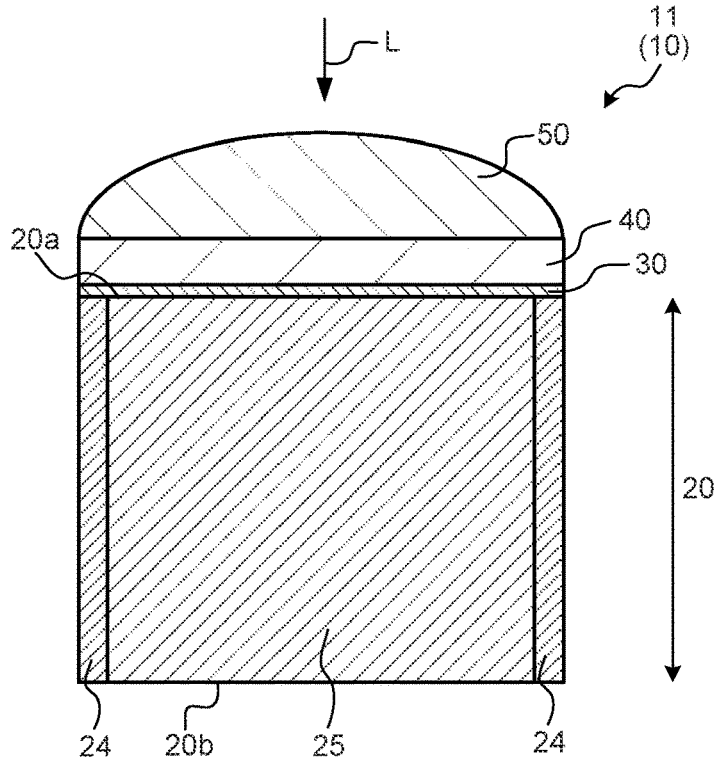
FIG. 27 is an arrow sectional view taken along line D-D illustrated in FIG. 25.

As illustrated in FIG. 26 and FIG. 27, the first separation region 24 is provided to pierce through the semiconductor layer 20. The first separation region 24 is made of, for example, a dielectric having a low refractive index such as silicon oxide (SiO$_2$). Consequently, the first separation region 24 can optically and electrically separate the plurality of light receiving pixels 11 adjacent to each other.

As illustrated in FIG. 25, the second separation region 25 is disposed among the four photodiodes PD adjacent to one another in the one light receiving pixel 11. As illustrated in FIG. 26, the second separation region 25 is provided to pierce the semiconductor layer 20.

The second separation region 25 is made of, for example, a dielectric having a low refractive index such as silicon oxide. Consequently, the second separation region 25 can optically and electrically separate the four photodiodes PD adjacent to one another.

As explained above, in the second embodiment, since the four photodiodes PD can be separated from one another using the second separation region 25, it is possible to detect a phase difference of the incident light L using the four photodiodes PD.

In the second embodiment, since the four photodiodes PD are provided in the one light receiving pixel 11, it is possible to obtain an image with a high dynamic range (HDR) without requiring a plurality of times of imaging.

Here, in the second embodiment, as illustrated in FIG. 25, the second separation region 25 is disposed along two diagonal lines of the first separation region 24 having a rectangular shape in plan view. For example, when four corners of the first separation region 24 having the rectangular shape in plan view are represented as the corner C1, the corner C2, the corner C3, and the corner C4 in clockwise order from the upper right, the second separation region 25 is disposed along a diagonal line extending between the corner C1 and the corner C3 and a diagonal line extending between the corner C2 and the corner C4. That is, the second separation region 25 according to the second embodiment has a substantially X-shape in plan view.

Consequently, the volume of the photodiodes PD can be increased as compared with when the second separation region 25 is disposed along different directions (for example, directions respectively substantially parallel to two perpendicular sides of first separation region 24) in plan view. Therefore, according to the second embodiment, the saturation signal charge amount of the photodiodes PD can be increased in the phase difference detection pixel.

In the second embodiment, the first separation region 24 and the second separation region 25 may be provided to pierce through the semiconductor layer 20. Consequently, as illustrated in FIG. 26, the second impurity region 22 can be formed not only in the bottom but also on the side of the first impurity region 21.

This is because, in a process for forming the first separation region 24 and the second separation region 25, the impurity of the second conduction type can also be diffused from sidewalls of trenches formed in parts corresponding to the first separation region 24 and the second separation region 25.

Therefore, according to the second embodiment, since the area of PN junction surfaces of the photodiodes PD can be enlarged, the saturation signal charge amount of the photodiodes PD can be further increased.

Explanation of other parts in the pixel array unit 10 is continued. The light receiving pixel 11 further includes the contact regions 26, floating diffusions FD1 to FD4, and transfer gates TG1 to TG4. The contact regions 26, the floating diffusions FD1 to FD4, and the transfer gates TG1 to TG4 are provided on the surface 20b on the opposite side to the light incident surface 20a of the semiconductor layer 20.

The contact regions 26 are electrically connected to a reference potential line and are respectively disposed at the corners C1 to C4 of the light receiving pixel 11 in plan view as illustrated in FIG. 25.

The floating diffusion FD1 is a part of the floating diffusion FD (see FIG. 24), is adjacent to an intersection of the second separation region 25 in plan view, and is disposed between the intersection of the second separation region 25 and the photodiode PD1.

The floating diffusion FD2 is a part of the floating diffusion FD, is adjacent to the intersection of the second separation region 25 in plan view, and is disposed between the intersection of the second separation region 25 and the photodiode PD2.

The floating diffusion FD3 is a part of the floating diffusion FD, is adjacent to the intersection of the second separation region 25 in plan view, and is disposed between the intersection of the second separation region 25 and the photodiode PD3.

The floating diffusion FD4 is a part of the floating diffusion FD, is adjacent to the intersection of the second separation region 25 in plan view, and is disposed between the intersection of the second separation region 25 and the photodiode PD4.

Note that, since the floating diffusions FD1 to FD4 are electrically connected via a not-illustrated wiring layer, the photodiodes PD1 to PD4 share the floating diffusion FD.

The transfer gate TG1 is adjacent to the floating diffusion FD1 in plan view and is disposed to block the floating diffusion FD1 and the photodiode PD1.

The transfer gate TG2 is adjacent to the floating diffusion FD2 in plan view and is disposed to block the floating diffusion FD2 and the photodiode PD2.

The transfer gate TG3 is adjacent to the floating diffusion FD3 in plan view and is disposed to block the floating diffusion FD3 and the photodiode PD3.

The transfer gate TG4 is adjacent to the floating diffusion FD4 in plan view and is disposed to block the floating diffusion FD4 and the photodiode PD4.

In the second embodiment, the pixel transistor and the active region AA of the pixel transistor are disposed to respectively overlap the four photodiodes PD in plan view.

For example, in plan view, the switching transistor FDG is disposed to overlap the photodiode PD1 and the amplification transistor AMP is disposed to overlap the photodiode PD2.

In plan view, the selection transistor SEL is disposed to overlap the photodiode PD3 and the reset transistor RST is disposed to overlap the photodiode PD4.

In the second embodiment, since the light receiving pixel 11 has such a planar configuration, the floating diffusions FD, the contact regions 26, and the pixel transistors can be efficiently disposed. Therefore, according to the second embodiment, it is possible to improve the layout efficiency of the pixel array unit 10.

As illustrated in FIG. 26 and the like, the planarizing film 30 is disposed on the light incident surface 20a of the semiconductor layer 20 and planarizes the light incident surface 20a. The planarizing film 30 is made of, for example, silicon oxide.

In the second embodiment, a not-illustrated fixed charge film may be disposed between the photodiode PD and the first separation region 24, the second separation region 25, and the planarizing film 30. Such a fixed charge film has a function of fixing a charge (here, a hole) to an interface between the photodiode PD and the first separation region 24, the second separation region 25, and the planarizing film 30.

As the material of the fixed charge film, it is preferable to use a high dielectric material having a lot of fixed charges. As the fixed charge film, for example, the same material as the material of the fixed charge film according to the first embodiment explained above can be used.

The color filter 40 is an optical filter that transmits light in a predetermined wavelength region in the incident light L and is provided between the on-chip lens 50 and the planarizing film 30.

The on-chip lens 50 is provided on a side where the light L is made incident on the semiconductor layer 20 and has a function of condensing the light L toward the light receiving pixel 11 corresponding to the on-chip lens 50. The on-chip lens 50 is made of, for example, an organic material, silicon oxide, or the like.

In the second embodiment, as illustrated in FIG. 26 and FIG. 27, one on-chip lens 50 is provided for each one light receiving pixel 11 (that is, one on-chip lens 50 is provided for every four photodiodes PD). Consequently, the light receiving pixel 11 functions as the phase difference detection pixel.

Various Modifications of the Second Embodiment

Subsequently, various modifications of the second embodiment are explained with reference to FIG. 28 to FIG. 43.

<Modification 1>

Figure 28:
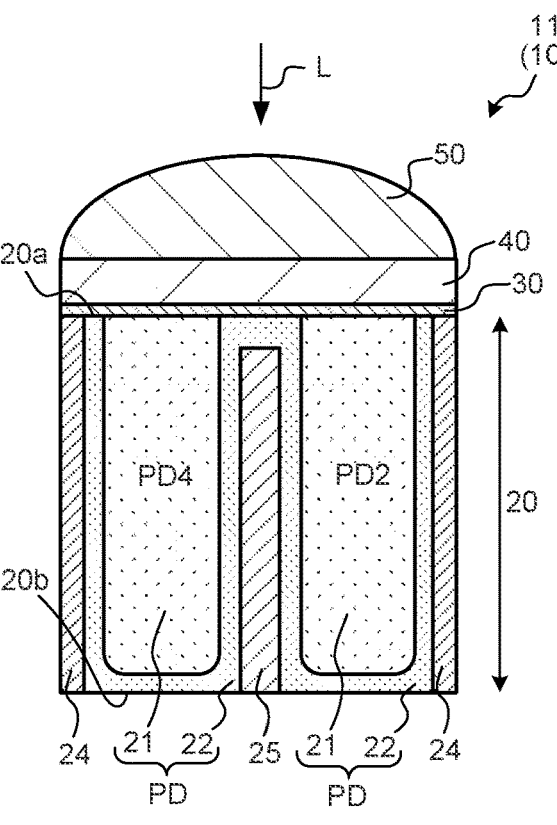
FIG. 28 is a sectional view illustrating an example of a configuration of the light receiving pixel according to a modification 1 of the second embodiment of the present disclosure.

FIG. 28 is a sectional view illustrating an example of a configuration of the light receiving pixel 11 according to a modification 1 of the second embodiment of the present disclosure and is a view corresponding to FIG. 26 in the second embodiment. As illustrated in FIG. 28, in the modification 1 of the second embodiment, the second separation region 25 is provided from the surface 20b on the opposite side to the light incident surface 20a of the semiconductor layer 20 to halfway in the semiconductor layer 20 (that is, not to pierce through the semiconductor layer 20).

Consequently, as in the second embodiment explained above, the second impurity region 22 can be formed not only in the bottom portion but also on the side of the first impurity region 21. This is because, in a process for forming the first separation region 24 and the second separation region 25, the impurity of the second conduction type can also be diffused from sidewalls of trenches formed in parts corresponding to the first separation region 24 and the second separation region 25.

Therefore, according to the modification 1 of the second embodiment, since the area of the PN junction surfaces of the photodiodes PD can be enlarged, the saturation signal charge amount of the photodiodes PD can be further increased.

In the modification 1, as illustrated in FIG. 28, since the second impurity region 22 is disposed on the light incident surface 20a side of the second separation region 25, it is possible to cause the second impurity region 22 to also function as the overflow path connecting the pair of photodiodes PD.

Therefore, according to the modification 1 of the second embodiment, it is possible to cause the light receiving pixel 11 to more satisfactorily function as the phase difference detection pixel.

<Modification 2>

Figure 29:
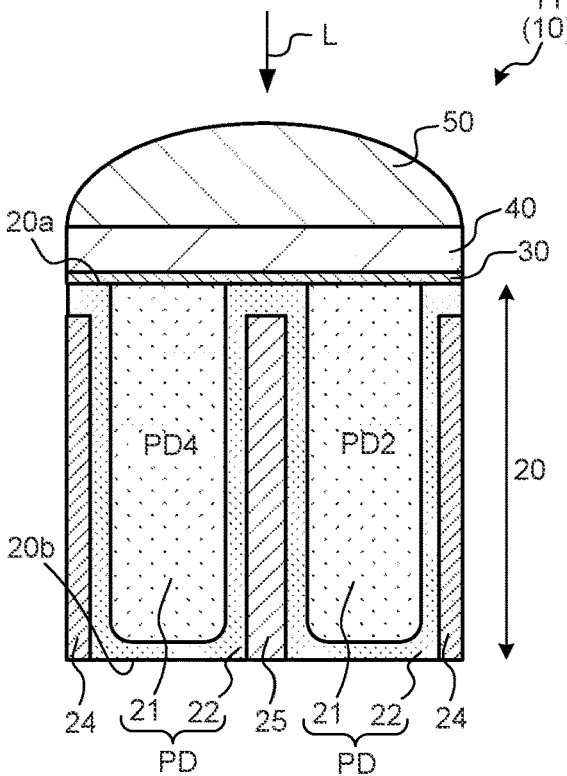
FIG. 29 is a sectional view illustrating an example of a configuration of the light receiving pixel according to a modification 2 of the second embodiment of the present disclosure.

FIG. 29 is a sectional view illustrating an example of a configuration of the light receiving pixel 11 according to a modification 2 of the second embodiment of the present disclosure. As illustrated in FIG. 29, in the modification 2 of the second embodiment, the first separation region 24 and the second separation region 25 are provided from the surface 20b on the opposite side to the light incident surface 20a of the semiconductor layer 20 to halfway in the semiconductor layer 20 (that is, not to pierce through the semiconductor layer 20).

Consequently, as in the second embodiment explained above, the second impurity region 22 can be formed not only in the bottom but also on the side of the second impurity region 22. This is because, in a process for forming the first separation region 24 and the second separation region 25, the impurity of the second conduction type can also be diffused from sidewalls of trenches formed in parts corresponding to the first separation region 24 and the second separation region 25.

Therefore, according to the modification 2 of the second embodiment, since the area of the PN junction surfaces of the photodiodes PD can be enlarged, the saturation signal charge amount of the photodiodes PD can be further increased.

In this modification 2, as illustrated in FIG. 29, since the second impurity region 22 is disposed on the light incident surface 20a side of the second separation region 25, it is possible to cause the second impurity region 22 to also function as the overflow path connecting the pair of photodiodes PD.

Therefore, according to the modification 2 of the second embodiment, it is possible to cause the light receiving pixel 11 to more satisfactorily function as the phase difference detection pixel.

<Modification 3>

Figure 30:
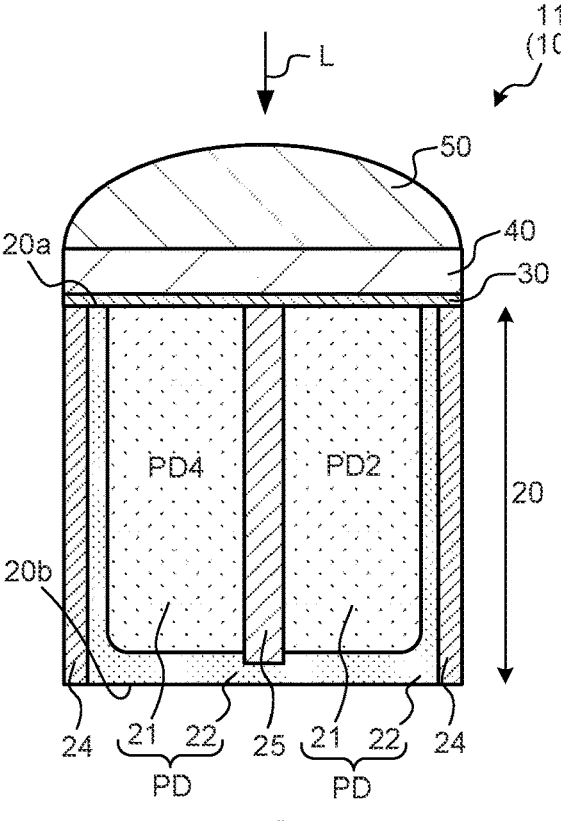
FIG. 30 is a sectional view illustrating an example of a configuration of the light receiving pixel according to a modification 3 of the second embodiment of the present disclosure.

FIG. 30 is a sectional view illustrating an example of a configuration of the light receiving pixel 11 according to a modification 3 of the second embodiment of the present disclosure. As illustrated in FIG. 30, in the modification 3 of the second embodiment, the second separation region 25 is provided from the light incident surface 20a of the semiconductor layer 20 to halfway in the semiconductor layer 20 (that is, not to pierce through the semiconductor layer 20).

Consequently, as in the second embodiment explained above, the four photodiodes PD can be separated in the second separation region 25. Therefore, according to the modification 3 of the second embodiment, it is possible to cause the light receiving pixel 11 to function as the phase difference detection pixel.

Furthermore, in this modification 3, as illustrated in FIG. 30, since the second impurity region 22 is disposed on the opposite side to the light incident surface 20a of the second separation region 25, it is possible to cause the second impurity region 22 to also function as the overflow path connecting the pair of photodiodes PD.

Therefore, according to the modification 3 of the second embodiment, it is possible to cause the light receiving pixel 11 to more satisfactorily function as the phase difference detection pixel.

<Modification 4>

Figure 31:
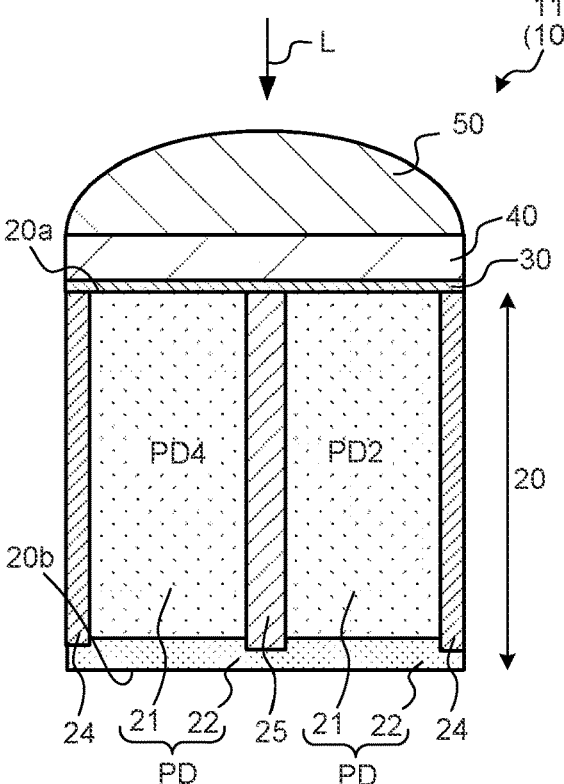
FIG. 31 is a sectional view illustrating an example of a configuration of the light receiving pixel according to a modification 4 of the second embodiment of the present disclosure.

FIG. 31 is a sectional view illustrating an example of a configuration of the light receiving pixel 11 according to a modification 4 of the second embodiment of the present disclosure. As illustrated in FIG. 31, in the modification 4 of the second embodiment, the first separation region 24 and the second separation region 25 are provided from the light incident surface 20a of the semiconductor layer 20 to halfway in the semiconductor layer 20 (that is, not to penetrate the semiconductor layer 20).

Consequently, as in the second embodiment explained above, the four photodiodes PD can be separated in the second separation region 25. Therefore, according to the modification 4 of the second embodiment, it is possible to cause the light receiving pixel 11 to function as the phase difference detection pixel.

In this modification 4, as illustrated in FIG. 31, since the second impurity region 22 is disposed on the opposite side to the light incident surface 20a of the second separation region 25, it is possible to cause the second impurity region 22 to also function as the overflow path connecting the pair of photodiodes PD.

Therefore, according to the modification 4 of the second embodiment, it is possible to cause the light receiving pixel 11 to more satisfactorily function as the phase difference detection pixel.

<Modification 5>

Figure 32:
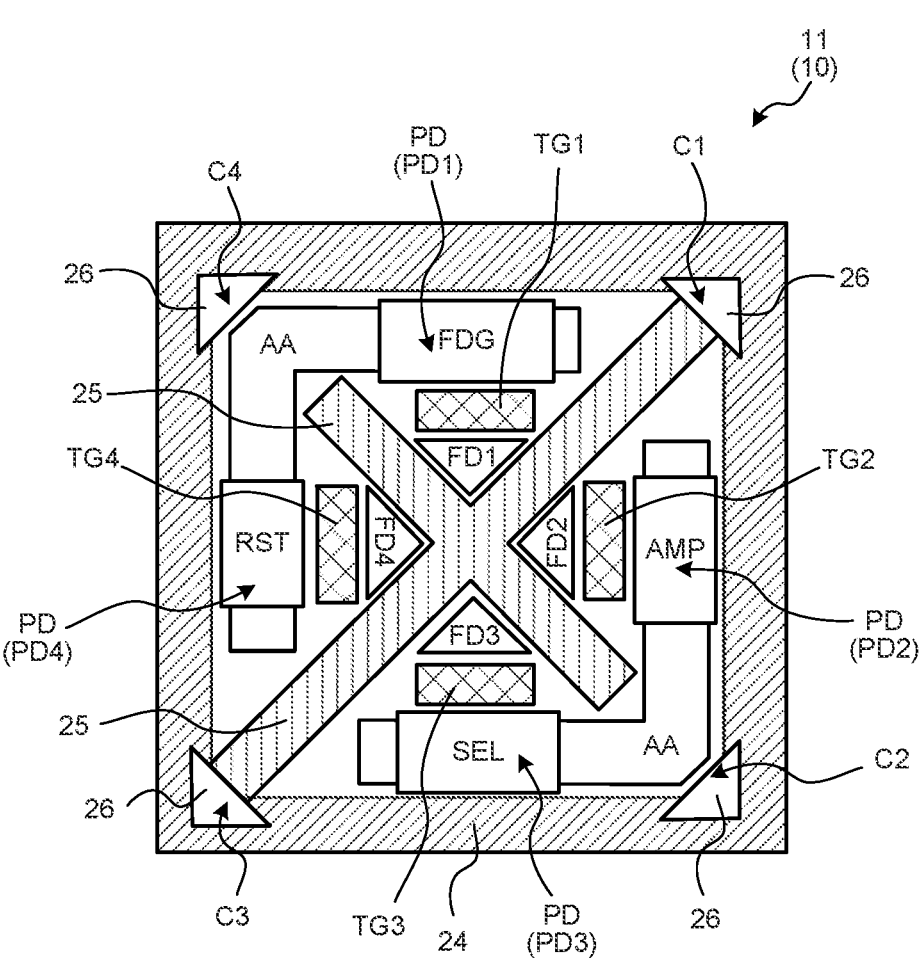
FIG. 32 is a plan view illustrating an example of a configuration of a light receiving pixel according to a modification 5 of the second embodiment of the present disclosure.

FIG. 32 is a plan view illustrating an example of a configuration of a light receiving pixel 11 according to a modification 5 of the second embodiment of the present disclosure. In the modification 5 of the second embodiment, the configuration of the second separation region 25 is different from the configuration in the second embodiment (FIG. 25).

Specifically, as illustrated in FIG. 32, the second separation region 25 has an end not in contact with the first separation region 24 in plan view. For example, in this modification 5, the first separation region 24 and the second separation region 25 are not in contact with each other at the corner C2 and the corner C4.

Consequently, the overflow path connecting the pair of photodiodes PD adjacent to a gap formed between the first separation region 24 and the second separation region 25 can be disposed in the gap.

For example, an overflow path connecting the photodiode PD2 and the photodiode PD3 can be disposed in a gap adjacent to the corner C2. An overflow path connecting the photodiode PD1 and the photodiode PD4 can be disposed in a gap adjacent to the corner C4.

That is, in this modification 5, it is possible to prevent the volume of the photodiodes PD from decreasing by separately forming such overflow paths. Therefore, according to the modification 5 of the second embodiment, it is possible to further increase the saturation signal charge amount of the photodiodes PD in the phase difference detection pixel.

In this modification 5, since the second separation region 25 includes the end not in contact with the first separation region 24 in plan view, a pixel transistor and the like can be disposed in a gap formed between the first separation region 24 and the second separation region 25.

For example, in the example illustrated in FIG. 32, the substantially L-shaped active region AA is disposed along the corner C2 in plan view and different pixel transistors (for example, the amplification transistor AMP and the selection transistor SEL) are respectively disposed on two sides of the active region AA.

In plan view, the substantially L-shaped active region AA is disposed along the corner C4 and different pixel transistors (for example, the reset transistor RST and the switching transistor FDG) are disposed on two sides of the active region AA.

That is, in this modification 5, since the second separation region 25 includes the end not in contact with the first separation region 24 in plan view, it is possible to improve the layout efficiency of the pixel array unit 10.

In this modification 5, by disposing the substantially L-shaped active region AA in the light receiving pixel 11, the area of the active region AA can be secured large. Therefore, according to the modification 5 of the second embodiment, it is possible to further improve the layout efficiency of the pixel array unit 10.

<Modification 6>

Figure 33:
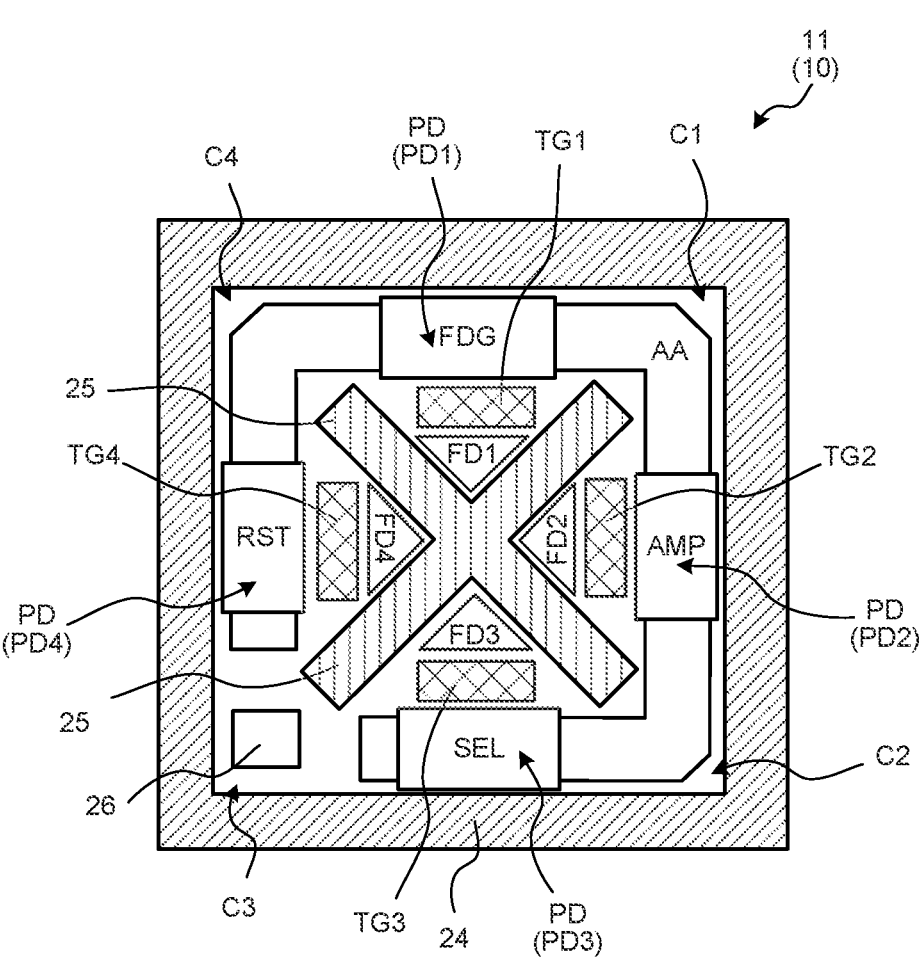
FIG. 33 is a plan view illustrating an example of a configuration of the light receiving pixel according to a modification 6 of the second embodiment of the present disclosure.

FIG. 33 is a plan view illustrating an example of a configuration of the light receiving pixel 11 according to a modification 6 of the second embodiment of the present disclosure. In the modification 6 of the second embodiment, the configuration of the second separation region 25 is different from the configuration in the modification 5 (FIG. 32) explained above.

Specifically, as illustrated in FIG. 33, the first separation region 24 and the second separation region 25 are not in contact with each other. Consequently, the overflow path connecting the pair of photodiodes PD adjacent to a gap formed between the first separation region 24 and the second separation region 25 can be disposed in the gap.

That is, in this modification 6, it is possible to prevent the volume of the photodiodes PD from decreasing by separately forming such an overflow path. Therefore, according to the modification 6 of the second embodiment, it is possible to further increase the saturation signal charge amount of the photodiodes PD in the phase difference detection pixel.

Furthermore, in this modification 6, since the first separation region 24 and the second separation region 25 are not in contact with each other, a pixel transistor and the like can be disposed in the gap formed between the first separation region 24 and the second separation region 25.

For example, in the example illustrated in FIG. 33, a substantially C-shaped active region AA extending from the vicinity of the corner C3 to the vicinity of the corner C4, the corner C1, the corner C2, and the corner C3 is disposed in plan view. Different pixel transistors (for example, the amplification transistor AMP, the selection transistor SEL, the reset transistor RST, and the switching transistor FDG) are respectively disposed on four sides of the active region AA. One contact region 26 is disposed near the corner C3.

That is, in this modification 6, since the first separation region 24 and the second separation region 25 are not in contact with each other, it is possible to further improve the layout efficiency of the pixel array unit 10.

In this modification 6, by disposing the substantially C-shaped active region AA in the light receiving pixel 11, the area of the active region AA can be secured larger. Therefore, according to the modification 6 of the second embodiment, it is possible to further improve the layout efficiency of the pixel array unit 10.

<Modification 7>

Figure 34:
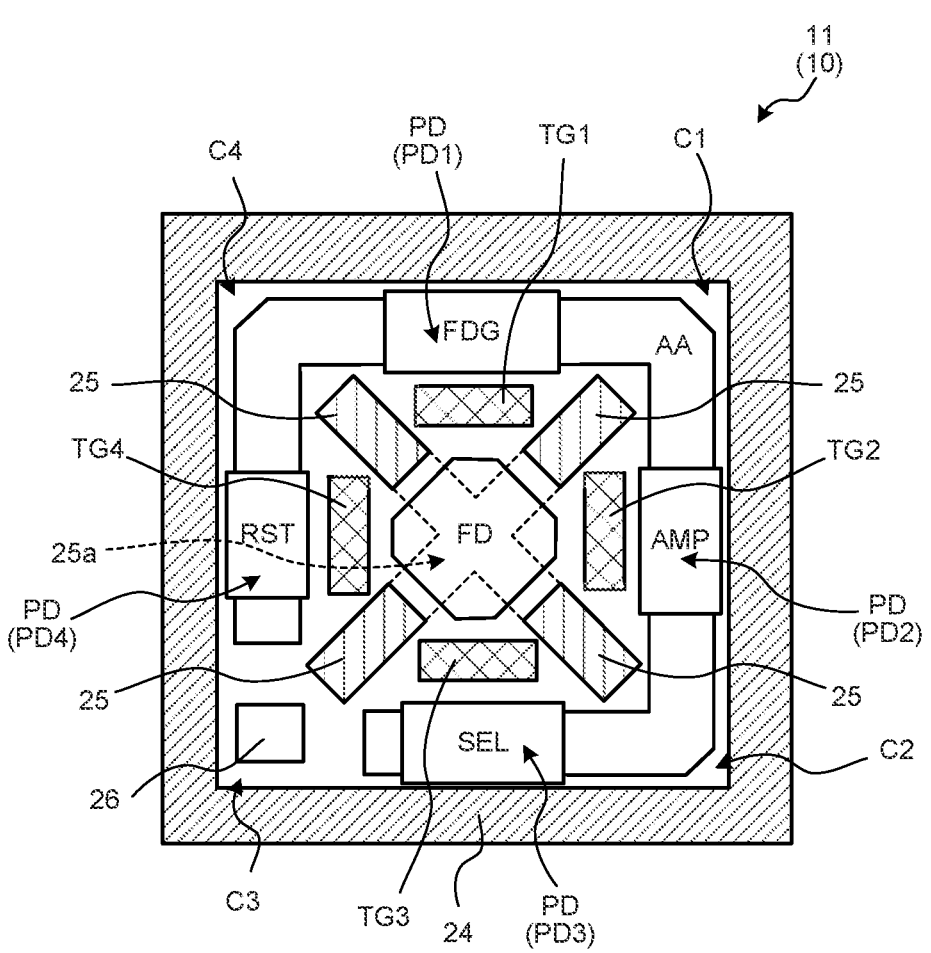
FIG. 34 is a plan view illustrating an example of a configuration of the light receiving pixel according to a modification 7 of the second embodiment of the present disclosure.

FIG. 34 is a plan view illustrating an example of a configuration of the light receiving pixel 11 according to a modification 7 of the second embodiment of the present disclosure. In the modification 7 of the second embodiment, the configuration of the second separation region 25 is different from the configuration in the modification 6 (FIG. 33) explained above.

Specifically, as illustrated in FIG. 33, in the second separation region 25 having a substantially X-shape in plan view, the second separation region 25 is not provided at an intersection. In other words, in the modification 7, the second separation region 25 includes a cutout 25a at the intersection.

Consequently, the overflow path connecting the pair of photodiodes PD adjacent to a gap formed in the cutout 25a can be disposed in the gap.

That is, in this modification 7, it is possible to present the volume of the photodiodes PD from decreasing by separately forming such an overflow path. Therefore, according to the modification 7 of the second embodiment, it is possible to further increase the saturation signal charge amount of the photodiodes PD in the phase difference detection pixel.

Further, in the modification 7, since the second separation region 25 includes the cutout 25a, the floating diffusion FD can be disposed in the cutout 25a. That is, in this modification 7, since the second separation region 25 includes the cutout 25a, it is possible to further improve the layout efficiency of the pixel array unit 10.

In this modification 7, by disposing the cutout 25a of the second separation region 25 in the center of the light receiving pixel 11 in plan view, one floating diffusion FD shared by the four photodiodes PD can be disposed.

Consequently, in the modification 7 of the second embodiment, since the area of the floating diffusion FD can be secured larger, it is possible to further improve the layout efficiency of the pixel array unit 10.

<Modifications 8 to 16>

A planar configuration of the second separation region 25 in the present disclosure is not limited to the examples in the second embodiment and the modifications 5 to 7 explained above. FIG. 35 to FIG. 43 are plan views illustrating examples of a configuration of the light receiving pixel 11 according to modifications 8 to 16 of the second embodiment of the present disclosure. Note that, in FIG. 35 to FIG. 16, to facilitate understanding, illustration of elements other than the first separation region 24 and the second separation region 25 in the light receiving pixel 11 is omitted.

Figure 35:
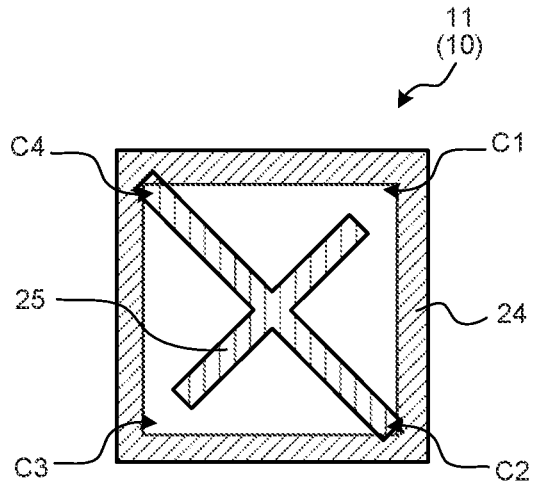
FIG. 35 is a plan view illustrating an example of a configuration of the light receiving pixel according to a modification 8 of the second embodiment of the present disclosure.

For example, as illustrated in FIG. 35, the end of the second separation region 25 having the substantially X-shape in plan view may be in contact with the first separation region 24 at the corner C2 and the corner C4 and may not be in contact with the first separation region 24 at the corner C1 and the corner C3.

Figure 36:
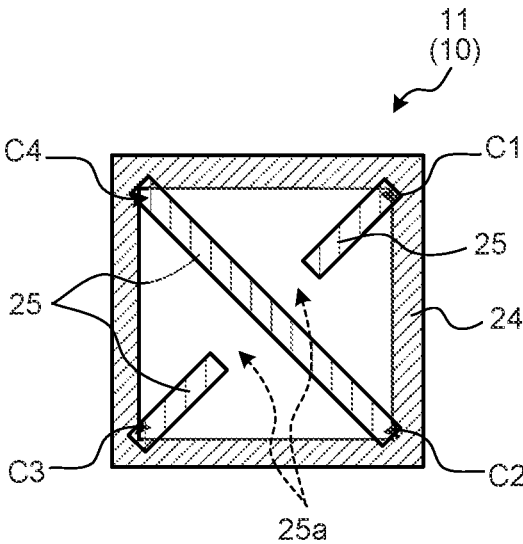
FIG. 36 is a plan view illustrating an example of a configuration of the light receiving pixel according to a modification 9 of the second embodiment of the present disclosure.

In addition, as illustrated in FIG. 36, the end of the second separation region 25 having the substantially X-shape in plan view may be in contact with the first separation region 24 at all the corners C1 to C4 and may include, in parts extending from the corner C1 and the corner C3 toward the intersection, the cutout 25a in the vicinity of the intersection.

Figure 37:
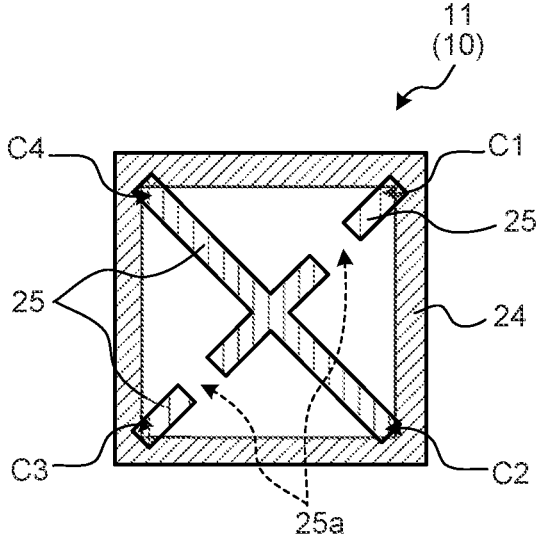
FIG. 37 is a plan view illustrating an example of a configuration of the light receiving pixel according to a modification 10 of the second embodiment of the present disclosure.

As illustrated in FIG. 37, the end of the second separation region 25 having the substantially X-shape in plan view may be in contact with the first separation region 24 at all the corners C1 to C4 and may include the cutout 25a in an intermediate portion of the parts extending from the corner C1 and the corner C3 toward the intersection.

Figure 38:
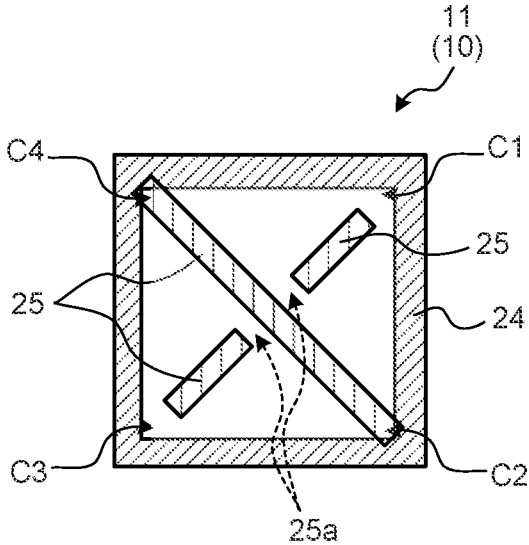
FIG. 38 is a plan view illustrating an example of a configuration of the light receiving pixel according to a modification 11 of the second embodiment of the present disclosure.

As illustrated in FIG. 38, the end of the second separation region 25 having the substantially X-shape in plan view is in contact with the first separation region 24 at the corner C2 and the corner C4. On the other hand, in the example illustrated in FIG. 38, the end of the second separation region 25 may not be in contact with the first separation region 24 at the corner C1 and the corner C3 and may include the cutout 25*a* in the vicinity of the intersection in the parts extending from the corner C1 and the corner C3 toward the intersection.

Figure 39:
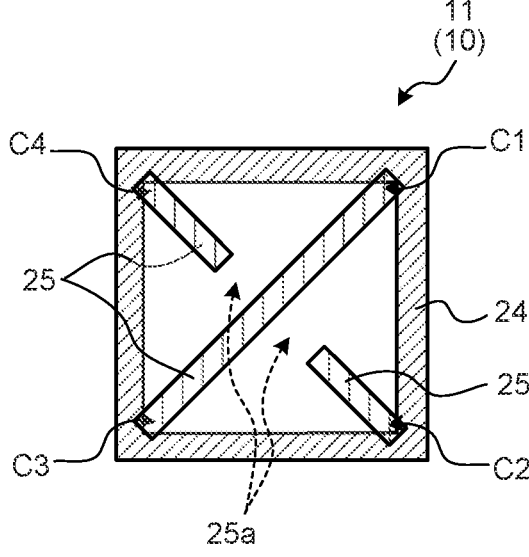
FIG. 39 is a plan view illustrating an example of a configuration of the light receiving pixel according to a modification 12 of the second embodiment of the present disclosure.

As illustrated in FIG. 39, the end of the second separation region 25 having the substantially X-shape in plan view may be in contact with the first separation region 24 at all the corners C1 to C4 and may include the cutout 25*a* in the vicinity of the intersection in parts extending from the corner C2 and the corner C4 toward the intersection.

Figure 40:
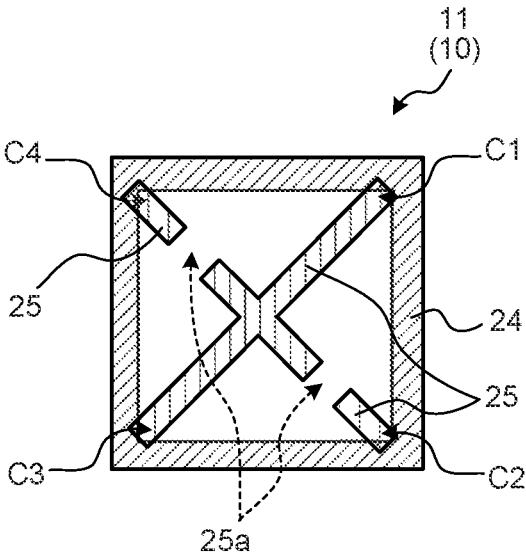
FIG. 40 is a plan view illustrating an example of a configuration of the light receiving pixel according to a modification 13 of the second embodiment of the present disclosure.

As illustrated in FIG. 40, the end of the second separation region 25 having the substantially X-shape in plan view may be in contact with the first separation region 24 at all the corners C1 to C4 and may include the cutout 25*a* at an intermediate portion of the parts extending from the corner C2 and the corner C4 toward the intersection.

Figure 41:
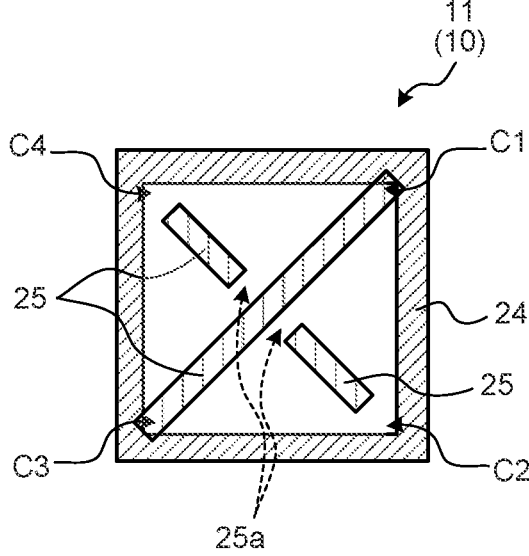
FIG. 41 is a plan view illustrating an example of a configuration of the light receiving pixel according to a modification 14 of the second embodiment of the present disclosure.

As illustrated in FIG. 41, the end of the second separation region 25 having the substantially X-shape in plan view is in contact with the first separation region 24 at the corner C1 and the corner C3. On the other hand, in the example illustrated in FIG. 41, the end of the second separation region 25 may not be in contact with the first separation region 24 at the corner C2 and the corner C4 and may include the cutout 25*a* in the vicinity of the intersection in the parts extending from the corner C2 and the corner C4 toward the intersection portion.

Figure 42:
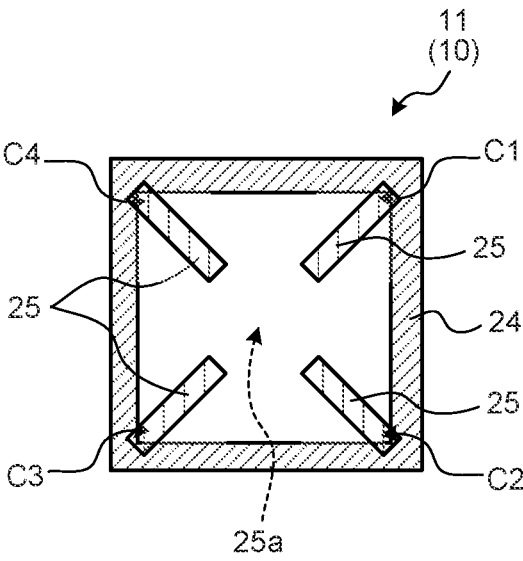
FIG. 42 is a plan view illustrating an example of a configuration of a light receiving pixel according to a modification 15 of the second embodiment of the present disclosure.

As illustrated in FIG. 42, the end of the second separation region 25 having the substantially X-shape in plan view may be in contact with the first separation region 24 at all the corners C1 to C4 and may include the cutout 25*a* at the intersection of the second separation region 25.

Figure 43:
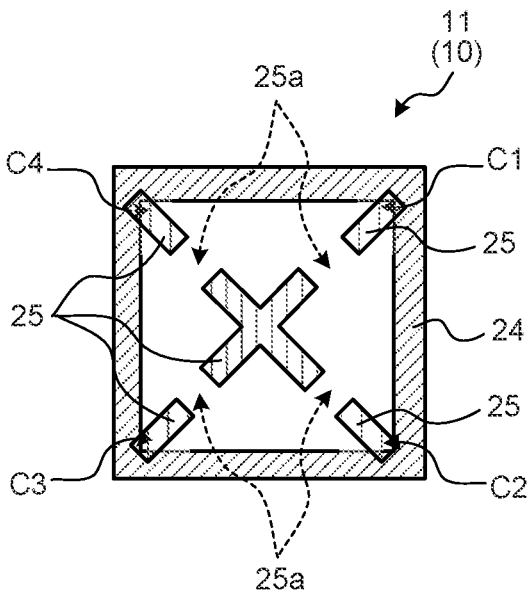
FIG. 43 is a plan view illustrating an example of a configuration of the light receiving pixel according to a modification 16 of the second embodiment of the present disclosure.

As illustrated in FIG. 43, the end of the second separation region 25 having the substantially X-shape in plan view may be in contact with the first separation region 24 at all the corners C1 to C4 and may include the cutout 25*a* at an intermediate portion of parts extending from the corners C1 to C4 toward the intersection.

In the examples illustrated in FIG. 35 to FIG. 43, since the second separation region 25 is disposed along two diagonal lines in the first separation region 24 having a rectangular shape in plan view, the volume of the photodiode PD can be increased. Therefore, according to the examples illustrated in FIG. 35 to FIG. 43, the saturation signal charge amount of the photodiodes PD can be increased in the phase difference detection pixel.

In the examples illustrated in FIG. 35 to FIG. 43, since the second separation region 25 includes the cutout 25*a*, it is possible to improve the layout efficiency of the pixel array unit 10.

[Effects]

The solid-state imaging element 1 according to the first embodiment includes the plurality of light receiving pixels 11 arranged in a matrix on the inside of the semiconductor layer 20. The light receiving pixel 11 includes the pair of photoelectric conversion units (photodiodes PD), the first separation region 24, and the second separation region 25. The pair of photoelectric conversion units (photodiodes PD) is disposed adjacent to each other and includes a shared floating diffusion FD. The first separation region 24 is disposed to surround the pair of photoelectric conversion units (photodiodes PD). The second separation region 25 is disposed between a pair of photoelectric conversion units (photodiodes PD). The first separation region 24 has the rectangular shape in plan view and is provided to extend from the surface 20*b* on the opposite side to the light incident surface 20*a* of the semiconductor layer 20 toward the light incident surface 20*a*. The second separation region 25 is disposed along the diagonal line of the first separation region 24 having the rectangular shape in plan view and is provided to extend from the surface 20*b* on the opposite side to the light incident surface 20*a* of the semiconductor layer 20 toward the light incident surface 20*a*.

Consequently, the saturation signal charge amount of the photodiodes PD can be increased in the phase difference detection pixel.

In the solid-state imaging element 1 according to the first embodiment, the first separation region 24 and the second separation region 25 are not in contact with each other in plan view.

Consequently, it is possible to further increase the saturation signal charge amount of the photodiodes PD in the phase difference detection pixel and it is possible to improve the layout efficiency of the pixel array unit 10.

The solid-state imaging element 1 according to the first embodiment further includes the pixel transistor provided on the surface 20*b* on the opposite side to the light incident surface 20*a* of the semiconductor layer 20. The pixel transistor is disposed at one corner C3 close to the end portion of the second separation region 25 among the four corners C1 to C4 of the first separation region 24 having a rectangular shape in plan view. The floating diffusion FD is disposed at another corner C1 close to the end of the second separation region 25 among the four corners C1 to C4 of the first separation region 24 having the rectangular shape in plan view.

Consequently, it is possible to improve the layout efficiency of the pixel array unit 10.

The solid-state imaging element 1 according to the first embodiment further includes the pixel transistor provided on the surface 20*b* on the opposite side to the light incident surface 20*a* of the semiconductor layer 20. The pixel transistor is disposed at the two corners C1 and C3 close to the end of the second separation region 25 among the four corners C1 to C4 of the first separation region 24 having the rectangular shape in plan view. The floating diffusion FD is disposed at the two corners C2 and C4 not close to the end of the second separation region 25 among the four corners C1 to C4 of the first separation region 24 having the rectangular shape in plan view.

Consequently, it is possible to improve the layout efficiency of the pixel array unit 10.

In the solid-state imaging element 1 according to the first embodiment, the active region AA of the pixel transistor has the substantially L shape in plan view.

Consequently, it is possible to further improve the layout efficiency of the pixel array unit 10.

In the solid-state imaging element 1 according to the first embodiment, the combination of the amplification transistor AMP and the selection transistor SEL or the combination of the reset transistor RST and the switching transistor FDG among the pixel transistors is disposed with respect to one active region AA.

Consequently, it is possible to further improve the layout efficiency of the pixel array unit 10.

In the solid-state imaging element 1 according to the first embodiment, the pixel transistor partially overlaps the second separation region 25 in plan view.

Consequently, it is possible to further improve the layout efficiency of the pixel array unit 10.

In the solid-state imaging element 1 according to the first embodiment, the light receiving pixel 11 further includes the contact region 26 provided on the surface 20*b* on the opposite side to the light incident surface 20a of the semi-conductor layer 20 and electrically connected to the reference potential line. The contact region 26 partially overlaps the second separation region 25 in plan view.

Consequently, it is possible to improve the layout efficiency of the pixel array unit 10.

The solid-state imaging element 1 according to the first embodiment includes the light receiving pixel group 100 including the plurality of light receiving pixels 11. The plurality of light receiving pixels 11 included in the same light receiving pixel group 100 includes the second separation regions 25 facing the different directions in plan view.

Consequently, it is possible to cause the light receiving pixel 11 to more satisfactorily function as the phase difference detection pixel.

The solid-state imaging element 1 according to the first embodiment further includes the transfer transistor TRG that transfers charges accumulated in the photoelectric conversion units (the photodiodes PD) to the floating diffusion FD. The gates (the transfer gates TG1 and TG2) of the transfer transistor TRG partially overlap the second separation region 25 in plan view.

Consequently, it is possible to improve the layout efficiency of the pixel array unit 10.

The solid-state imaging element 1 according to the second embodiment includes the plurality of light receiving pixels 11 arrayed in a matrix on the inside of the semiconductor layer 20. The light receiving pixel 11 includes the four photoelectric conversion units (photodiodes PD), the first separation region 24, and the second separation region 25. The four photoelectric conversion units (photodiodes PD) are disposed adjacent to one another and includes the shared floating diffusion FD. The first separation region 24 is disposed to surround the four photoelectric conversion units (photodiodes PD) and has the rectangular shape in plan view. The second separation region 25 is disposed to separate the four photoelectric conversion units (photodiodes PD) and is disposed along two diagonal lines in the first separation region 24 having the rectangular shape in plan view.

Consequently, the saturation signal charge amount of the photodiodes PD can be increased in the phase difference detection pixel.

In the solid-state imaging element 1 according to the second embodiment, the second separation region 25 includes the end not in contact with the first separation region 24 in plan view.

Consequently, it is possible to further increase the saturation signal charge amount of the photodiodes PD in the phase difference detection pixel and it is possible to improve the layout efficiency of the pixel array unit 10.

The solid-state imaging element 1 according to the second embodiment further includes the pixel transistor provided on the surface 20b on the opposite side to the light incident surface 20a of the semiconductor layer 20. The active region AA of the pixel transistor is disposed at the corner not in contact with the second separation region 25 among the four corners C1 to C4 of the first separation region 24 having the rectangular shape in plan view.

Consequently, it is possible to further improve the layout efficiency of the pixel array unit 10.

In the solid-state imaging element 1 according to the second embodiment, the second separation region 25 includes the cutout 25a at the intersection.

Consequently, it is possible to further improve the layout efficiency of the pixel array unit 10.

In the solid-state imaging element 1 according to the second embodiment, the floating diffusion FD is disposed to overlap the cutout 25a in plan view.

Consequently, it is possible to further improve the layout efficiency of the pixel array unit 10.

[Electronic Equipment]

Note that the present disclosure is not limited to application to the solid-state imaging element. That is, the present disclosure is applicable to, besides the solid-state imaging element, all kinds of electronic equipment including the solid-state imaging element such as a camera module, an imaging device, a mobile terminal device having an imaging function, or a copying machine using the solid-state imaging element in an image reading unit.

Examples of such an imaging device include a digital still camera and a video camera. Examples of such a portable terminal device having the imaging function include a smartphone and a tablet terminal.

Figure 44:
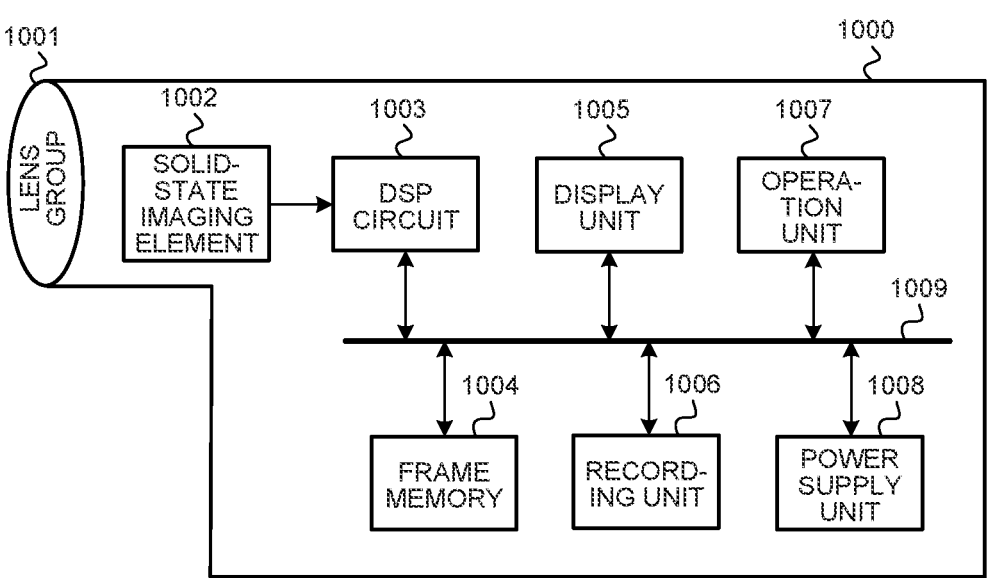
FIG. 44 is a block diagram illustrating a configuration example of an imaging device functioning as electronic equipment to which the technology according to the present disclosure is applied.

FIG. 44 is a block diagram illustrating a configuration example of an imaging device functioning as electronic equipment 1000 to which the technology according to the present disclosure is applied. The electronic equipment 1000 in FIG. 44 is, for example, electronic equipment such as an imaging device such as a digital still camera or a video camera or a mobile terminal device such as a smartphone or a tablet terminal.

In FIG. 44, the electronic equipment 1000 is configured from a lens group 1001, a solid-state imaging element 1002, a DSP circuit 1003, a frame memory 1004, a display unit 1005, a recording unit 1006, an operation unit 1007, and a power supply unit 1008.

In the electronic equipment 1000, the DSP circuit 1003, the frame memory 1004, the display unit 1005, the recording unit 1006, the operation unit 1007, and the power supply unit 1008 are mutually connected via a bus line 1009.

The lens group 1001 captures incident light (image light) from a subject and forms an image on an imaging surface of the solid-state imaging element 1002. The solid-state imaging element 1002 corresponds to the solid-state imaging element 1 according to the embodiment explained above and converts an amount of the incident light imaged on the imaging surface by the lens group 1001 into an electric signal in units of pixels and outputs the electric signal as a pixel signal.

The DSP circuit 1003 is a camera signal processing circuit that processes a signal supplied from the solid-state imaging element 1002. The frame memory 1004 temporarily holds image data processed by the DSP circuit 1003 in units of frames.

The display unit 1005 is configured from, for example, a panel type display device such as a liquid crystal panel or an organic electro luminescence (EL) panel and displays a moving image or a still image captured by the solid-state imaging element 1002. The recording unit 1006 records image data of a moving image or a still image captured by the solid-state imaging element 1002 in a recording medium such as a semiconductor memory or a hard disk.

The operation unit 1007 issues operation commands for various functions of the electronic equipment 1000 according to an operation by a user. The power supply unit 1008 appropriately supplies various kinds of electric power serving as operation power for the DSP circuit 1003, the frame memory 1004, the display unit 1005, the recording unit 1006, and the operation unit 1007 to these supply targets.

In the electronic equipment 1000 configured as explained above, signal quality can be improved by applying the solid-state imaging element 1 in the embodiments explained above as the solid-state imaging element 1002.

Although the embodiment of the present disclosure is explained above, the technical scope of the present disclosure is not limited to the embodiment explained above per se. Various changes are possible without departing from the gist of the present disclosure. Components in different embodiments and modifications may be combined as appropriate.

The effects described in the present specification are only examples and are not limited. There may be other effects.

Note that the present technology can also take the following configurations.

(1)

A solid-state imaging element comprising a plurality of light receiving pixels arrayed in a matrix on an inside of a semiconductor layer, wherein the light receiving pixel includes:

a pair of photoelectric conversion units disposed adjacent to one another and including a shared floating diffusion;

a first separation region disposed to surround the pair of photoelectric conversion units; and a second separation region disposed between the pair of photoelectric conversion units, wherein the first separation region has a rectangular shape in plan view and is provided to extend from a surface on an opposite side to a light incident surface of the semiconductor layer toward the light incident surface, and the second separation region is disposed along a diagonal line of the first separation region having a rectangular shape in plan view and is provided to extend from the surface on the opposite side to the light incident surface of the semiconductor layer toward the light incident surface.

(2)

The solid-state imaging element according to the above (1), wherein the first separation region and the second separation region are not in contact with each other in plan view.

(3)

The solid-state imaging element according to the above (2), further comprising a pixel transistor provided on the surface on the opposite side to the light incident surface of the semiconductor layer, wherein the pixel transistor is disposed at one corner close to an end of the second separation region among four corners of the first separation region having the rectangular shape in plan view, and the floating diffusion is disposed at another corner close to the end of the second separation region among the four corners of the first separation region having the rectangular shape in plan view.

(4)

The solid-state imaging element according to the above (2), further comprising pixel transistors provided on the surface on the opposite side to the light incident surface of the semiconductor layer, wherein the pixel transistors are disposed at two corners close to an end of the second separation region among four corners of the first separation region having the rectangular shape in plan view, and the floating diffusion is disposed at two corners that are not close to the end portion of the second separation region among the four corners of the first separation region having the rectangular shape in plan view.

(5)

The solid-state imaging element according to the above (3) or (4), wherein an active region of the pixel transistor has a substantially L-shape in plan view.

(6)

The solid-state imaging element according to the above (5), wherein a combination of an amplification transistor and a selection transistor or a combination of a reset transistor and a switching transistor among the pixel transistor is disposed in a singularity of the active region.

(7)

The solid-state imaging element according to any one of the above (3) to (6), wherein the pixel transistor partially overlaps the second separation region in plan view.

(8)

The solid-state imaging element according to any one of the above (1) to (7), wherein the light receiving pixel further includes a contact region provided on the surface on the opposite side to the light incident surface of the semiconductor layer and electrically connected to a reference potential line, and the contact region partially overlaps the second separation region in plan view.

(9)

The solid-state imaging element according to any one of the above (1) to (8), comprising a light receiving pixel group including a plurality of the light receiving pixels, wherein the plurality of the light receiving pixels included in the same light receiving pixel group have the second separation region facing different directions in plan view.

(10)

The solid-state imaging element according to any one of the above (1) to (9), further comprising a transfer transistor that transfers a charge accumulated in the photoelectric conversion unit to the floating diffusion, wherein a gate of the transfer transistor partially overlaps the second separation region in plan view.

(11)

Electronic equipment comprising:

a solid-state imaging element;

an optical system that captures incident light from a subject and forms an image on an imaging surface of the solid-state imaging element; and a signal processing circuit configured to perform processing on an output signal from the solid-state imaging element, wherein the solid-state imaging element includes a plurality of light receiving pixels arrayed in a matrix on an inside of the semiconductor layer, the light receiving pixel includes:

a pair of photoelectric conversion units disposed adjacent to each other and including a shared floating diffusion;

a first separation region disposed to surround the pair of photoelectric conversion units;

a second separation region disposed between the pair of photoelectric conversion units, the first separation region has a rectangular shape in plan view and is provided to extend from a surface on an opposite side to a light incident surface of the semiconductor layer toward the light incident surface, and the second separation region is disposed along a diagonal line of the first separation region having the rectangular shape in plan view and is provided to extend from the surface on the opposite side to the light incident surface of the semiconductor layer toward the light incident surface.

(12)

The electronic equipment according to the above (11), wherein the first separation region and the second separation region are not in contact with each other in plan view.

(13)

The electronic equipment according to the above (12), wherein the solid-state imaging element further includes a pixel transistor provided on a surface on an opposite side to a light incident surface of the semiconductor layer, the pixel transistor is disposed at one corner close to an end of the second separation region among four corners of the first separation region having the rectangular shape in plan view, and the floating diffusion is disposed at another corner close to an end portion of the second separation region among four corners of the first separation region having the rectangular shape in plan view.

(14)

The electronic equipment according to the above (12), wherein the solid-state imaging element further includes pixel transistors provided on a surface on an opposite side to a light incident surface of the semiconductor layer, the pixel transistors are disposed at two corners close to an end portion of the second separation region among four corners of the first separation region having the rectangular shape in plan view, and the floating diffusion is disposed at two corners not close to an end portion of the second separation region among four corners of the first separation region having the rectangular shape in plan view.

(15)

The electronic equipment according to the above (13) or (14), wherein an active region of the pixel transistor has a substantially L-shape in plan view.

(16)

The electronic equipment according to the above (15), wherein a combination of an amplification transistor and a selection transistor or a combination of a reset transistor and a switching transistor among the pixel transistor is disposed with respect to a singularity of the active region.

(17)

The electronic equipment according to any one of the above (13) to (16) above, wherein the pixel transistor partially overlaps the second separation region in plan view.

(18)

The electronic equipment according to any one of the above (11) to (17), wherein the light receiving pixel further includes a contact region provided on a surface on an opposite side to the light incident surface of the semiconductor layer and electrically connected to a reference potential line, and the contact region partially overlaps the second separation region in plan view.

(19)

The electronic equipment according to any one of the above (11) to (18), wherein the solid-state imaging element includes a light receiving pixel group including a plurality of the light receiving pixels, and the plurality of light receiving pixels included in the same light receiving pixel group includes the second separation region facing different directions in plan view.

(20)

The electronic equipment according to any one of the above (11) to (19), wherein the solid-state imaging element further includes a transfer transistor configured to transfer the charge accumulated in the photoelectric conversion unit to the floating diffusion, and a gate of the transfer transistor partially overlaps the second separation region in plan view.

(21)

A solid-state imaging element comprising a plurality of light receiving pixels arrayed in a matrix on an inside of a semiconductor layer, wherein the light receiving pixel includes:

four photoelectric conversion units disposed adjacent to one another and including a shared floating diffusion;

a first separation region disposed to surround the four photoelectric conversion units and having a rectangular shape in plan view; and a second separation region disposed to separate the four photoelectric conversion units and disposed along two diagonal lines in the first separation region having the rectangular shape in plan view.

(22)

The solid-state imaging element according to the above (21), wherein the second separation region includes an end not in contact with the first separation region in plan view.

(23)

The solid-state imaging element according to the above (22), wherein further comprising a pixel transistor provided on a surface on an opposite side to a light incident surface of the semiconductor layer, wherein the active region of the pixel transistor is disposed at a corner not in contact with the second separation region among four corners of the first separation region having a rectangular shape in plan view.

(24)

The solid-state imaging element according to any one of the above (21) to (23), wherein the second separation region includes a cutout at an intersection.

(25)

The solid-state imaging element according to the above (24), wherein the floating diffusion is disposed to overlap the cutout in plan view.

(26)

Electronic equipment comprising:

a solid-state imaging element;

an optical system that captures incident light from a subject and forms an image on an imaging surface of the solid-state imaging element; and a signal processing circuit that performs processing on an output signal from the solid-state imaging element, wherein the solid-state imaging element includes a plurality of light receiving pixels arrayed in a matrix on an inside of a semiconductor layer, the light receiving pixel includes:

four photoelectric conversion units disposed adjacent to one another and including a shared floating diffusion;

a first separation region disposed to surround the four photoelectric conversion units and has a rectangular shape in plan view; and a second separation region disposed to separate the four photoelectric conversion units and disposed along two diagonal lines in the first separation region having a rectangular shape in plan view.

(27)

The electronic equipment according to the above (26), wherein the second separation region includes an end not in contact with the first separation region in plan view.

(28)

The electronic equipment according to the above (27), wherein the solid-state imaging element further includes a pixel transistor provided on a surface on an opposite side to a light incident surface of the semiconductor layer, and an active region of the pixel transistor is disposed at a corner not in contact with the second separation region among four corners of the first separation region having the rectangular shape in plan view.

(29)

The electronic equipment according to any one of the above (26) to (28), wherein the second separation region includes a cutout at an intersection.

(30)

The electronic equipment according to the above (29), wherein the floating diffusion is disposed to overlap with the cutout in plan view.

REFERENCE SIGNS LIST

1 SOLID-STATE IMAGING ELEMENT
10 PIXEL ARRAY UNIT
11 LIGHT RECEIVING PIXEL
20 SEMICONDUCTOR LAYER
20a LIGHT INCIDENT SURFACE
20b SURFACE
24 FIRST SEPARATION REGION
25 SECOND SEPARATION REGION
25a CUTOUT
100 LIGHT RECEIVING PIXEL GROUP
1000 ELECTRONIC EQUIPMENT
C1 to C4 CORNER
AMP AMPLIFICATION TRANSISTOR (EXAMPLE OF PIXEL TRANSISTOR)
FD, FD1 to FD4 FLOATING DIFFUSION
FDG SWITCHING TRANSISTOR
PD, PD1 to PD4 PHOTODIODE (EXAMPLE OF PHOTOELECTRIC CONVERSION UNIT)
RST RESET TRANSISTOR (EXAMPLE OF PIXEL TRANSISTOR)
SEL SELECTION TRANSISTOR (EXAMPLE OF PIXEL TRANSISTOR)
TG1, TG2 TRANSFER GATE (EXAMPLE OF GATE)

What is claimed is:

1. A solid-state imaging element, comprising:
a plurality of light receiving pixels arrayed in a matrix on an inside of a semiconductor layer, wherein the light receiving pixel includes:

a pair of photoelectric conversion units disposed adjacent to one another and including a shared floating diffusion;

a first separation region disposed to surround the pair of photoelectric conversion units; and a second separation region disposed between the pair of photoelectric conversion units, wherein the first separation region has a rectangular shape in a plan view and is provided to extend from a surface on an opposite side to a light incident surface of the semiconductor layer toward the light incident surface, wherein the second separation region is disposed along a diagonal line of the first separation region having a rectangular shape in the plan view and is provided to extend from the surface on the opposite side to the light incident surface of the semiconductor layer toward the light incident surface, and wherein the first separation region and the second separation region are not in contact with each other in the plan view.

2. The solid-state imaging element according to claim 1, further comprising:

a pixel transistor provided on the surface on the opposite side to the light incident surface of the semiconductor layer, wherein the pixel transistor is disposed at one corner close to an end of the second separation region among four corners of the first separation region having the rectangular shape in the plan view, and wherein the floating diffusion is disposed at another corner close to the end of the second separation region among the four corners of the first separation region having the rectangular shape in the plan view.

3. The solid-state imaging element according to claim 1, further comprising pixel transistors provided on the surface on the opposite side to the light incident surface of the semiconductor layer, wherein the pixel transistors are disposed at two corners close to an end portion of the second separation region among four corners of the first separation region having the rectangular shape in the plan view, and the floating diffusion is disposed at two corners that are not close to the end portion of the second separation region among the four corners of the first separation region having the rectangular shape in the plan view.

4. The solid-state imaging element according to claim 2, wherein an active region of the pixel transistor has a substantially L-shape in the plan view.

5. The solid-state imaging element according to claim 4, wherein a combination of an amplification transistor and a selection transistor or a combination of a reset transistor and a switching transistor among the pixel transistor is disposed in a singularity of the active region.

6. The solid-state imaging element according to claim 2, wherein the pixel transistor partially overlaps the second separation region in the plan view.

7. The solid-state imaging element according to claim 1, wherein the light receiving pixel further includes a contact region provided on the surface on the opposite side to the light incident surface of the semiconductor layer and electrically connected to a reference potential line, and the contact region partially overlaps the second separation region in the plan view.

8. The solid-state imaging element according to claim 1, further comprising a light receiving pixel group including a plurality of the light receiving pixels, wherein the plurality of the light receiving pixels included in the light receiving pixel group have the second separation region facing different directions in the plan view.

9. The solid-state imaging element according to claim 1, further comprising a transfer transistor that transfers a charge accumulated in the photoelectric conversion unit to the floating diffusion, wherein a gate of the transfer transistor partially overlaps the second separation region in the plan view.

10. Electronic equipment, comprising:

a solid-state imaging element;

an optical system that captures incident light from a subject and forms an image on an imaging surface of the solid-state imaging element; and a signal processing circuit configured to perform processing on an output signal from the solid-state imaging element, wherein the solid-state imaging element includes a plurality of light receiving pixels arrayed in a matrix on an inside of a semiconductor layer, wherein each light receiving pixel in the plurality of light receiving pixels includes:

a pair of photoelectric conversion units disposed adjacent to each other and including a shared floating diffusion;

a first separation region disposed to surround the pair of photoelectric conversion units;

a second separation region disposed between the pair of photoelectric conversion units, wherein the first separation region has a rectangular shape in a plan view and is provided to extend from a surface on an opposite side to a light incident surface of the semiconductor layer toward the light incident surface, wherein the second separation region is disposed along a diagonal line of the first separation region having the rectangular shape in the plan view and is provided to extend from the surface on the opposite side to the light incident surface of the semiconductor layer toward the light incident surface, and wherein the first separation region and the second separation region are not in contact with each other in the plan view.

11. The electronic equipment according to claim 10, further comprising:

a pixel transistor provided on the surface on the opposite side to the light incident surface of the semiconductor layer, wherein the pixel transistor is disposed at one corner close to an end of the second separation region among four corners of the first separation region having the rectangular shape in the plan view, and wherein the floating diffusion is disposed at another corner close to the end of the second separation region among the four corners of the first separation region having the rectangular shape in the plan view.

12. The electronic equipment according to claim 10, further comprising pixel transistors provided on the surface on the opposite side to the light incident surface of the semiconductor layer, wherein the pixel transistors are disposed at two corners close to an end portion of the second separation region among four corners of the first separation region having the rectangular shape in the plan view, and the floating diffusion is disposed at two corners that are not close to the end portion of the second separation region among the four corners of the first separation region having the rectangular shape in the plan view.

13. The electronic equipment according to claim 11, wherein an active region of the pixel transistor has a substantially L-shape in the plan view.

14. The electronic equipment according to claim 13, wherein a combination of an amplification transistor and a selection transistor or a combination of a reset transistor and a switching transistor among the pixel transistor is disposed in a singularity of the active region.

15. The electronic equipment according to claim 11, wherein the pixel transistor partially overlaps the second separation region in the plan view.

16. The electronic equipment according to claim 10, wherein the light receiving pixel further includes a contact region provided on the surface on the opposite side to the light incident surface of the semiconductor layer and electrically connected to a reference potential line, and the contact region partially overlaps the second separation region in the plan view.

17. The electronic equipment according to to claim 10, further comprising a light receiving pixel group including a plurality of the light receiving pixels, wherein the plurality of the light receiving pixels included in the light receiving pixel group have the second separation region facing different directions in the plan view.

* * * * *